(12) United States Patent
Morita

(10) Patent No.: US 11,094,274 B2
(45) Date of Patent: Aug. 17, 2021

(54) CIRCUIT DEVICE, ELECTRO-OPTICAL DEVICE, AND ELECTRONIC APPARATUS

(71) Applicant: SEIKO EPSON CORPORATION, Tokyo (JP)

(72) Inventor: Akira Morita, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/024,140

(22) Filed: Sep. 17, 2020

(65) Prior Publication Data

US 2021/0082363 A1 Mar. 18, 2021

(30) Foreign Application Priority Data

Sep. 18, 2019 (JP) .............................. JP2019-168934

(51) Int. Cl.
| | |
|---|---|
| G09G 3/36 | (2006.01) |
| G02F 1/133 | (2006.01) |
| H03K 17/687 | (2006.01) |
| H03M 1/66 | (2006.01) |

(52) U.S. Cl.
CPC ....... *G09G 3/3648* (2013.01); *G02F 1/13306* (2013.01); *H03K 17/6872* (2013.01); *G09G 2300/043* (2013.01); *G09G 2300/0809* (2013.01); *G09G 2310/0291* (2013.01); *G09G 2320/0219* (2013.01); *H03M 1/66* (2013.01)

(58) Field of Classification Search
CPC ... G09G 2320/0271; G09G 2320/0276; G09G 2320/0673; G09G 2340/0428; G09G 3/0277; G09G 3/3607; G09G 2310/027; G09G 2310/0275; H04N 3/127
See application file for complete search history.

(56) References Cited

U.S. PATENT DOCUMENTS

| | | | |
|---|---|---|---|
| 2003/0179122 A1 | 9/2003 | Yamamura | |
| 2007/0052472 A1* | 3/2007 | Lin | G09G 3/3696 327/538 |
| 2009/0160881 A1* | 6/2009 | Kiya | G09G 3/3611 345/690 |
| 2009/0160882 A1* | 6/2009 | Kiya | G09G 3/3685 345/690 |
| 2016/0133218 A1 | 5/2016 | Morita | |

(Continued)

FOREIGN PATENT DOCUMENTS

| | | |
|---|---|---|
| JP | S60-174518 A | 9/1985 |
| JP | S60-254903 A | 12/1985 |
| JP | S61-214815 A | 9/1986 |

(Continued)

*Primary Examiner* — Sanghyuk Park
(74) *Attorney, Agent, or Firm* — Oliff PLC

(57) ABSTRACT

A circuit device includes a transfer gate, a charge compensation circuit, and a control circuit. The control circuit controls the charge compensation circuit. The charge compensation circuit discharges charge from an output node of the transfer gate when a voltage of an input signal to the transfer gate is in a first voltage range at a timing at which the transfer gate is turned off. The charge compensation circuit injects charge into the output node of the transfer gate when a voltage of the input signal to the transfer gate is in a second voltage range lower than that in the first voltage range at a timing at which the transfer gate is turned off.

15 Claims, 18 Drawing Sheets

(56) References Cited

U.S. PATENT DOCUMENTS

2018/0226047 A1    8/2018  Morita

FOREIGN PATENT DOCUMENTS

| JP | H08-335864 A | 12/1996 |
| JP | 2003-283337 A | 10/2003 |
| JP | 2006-148320 A | 6/2006 |
| JP | 2016-090881 A | 5/2016 |

\* cited by examiner

|   | TRANSISTOR SIZE (W) [um] | | PARASITIC CAPACITOR AT 7.5V [fF] | | PARASITIC CAPACITOR AT 12.5V [fF] | |
|---|---|---|---|---|---|---|
|   | PT | NT | PT | NT | PT | NT |
| 1 | 6.0 | 8.0 | 6.0 | 6.0 | 11.0 | 4.0 |
| 2 | 7.0 | 9.0 | 7.0 | 6.8 | 12.8 | 4.5 |
| 3 | 8.0 | 10.0 | 8.0 | 7.5 | 14.7 | 5.0 |
| 4 | 9.0 | 11.0 | 9.0 | 8.3 | 16.5 | 5.5 |

FIG. 8

1st Voltage Range (10~12.5V)

|   | PT | | NT | |
|---|---|---|---|---|
|   | Enable | Direction | Enable | Direction |
| 1 | 1 | 1 | 1 | 0 |
| 2 | 0 | 0 | 1 | 1 |
| 3 | 0 | 0 | 0 | 1 |
| 4 | 1 | 0 | 0 | 1 |

3rd Voltage Range (7.5~10V)

|   | PT | | NT | |
|---|---|---|---|---|
|   | Enable | Direction | Enable | Direction |
| 1 | 1 | 1 | 1 | 0 |
| 2 | 0 | 0 | 1 | 1 |
| 3 | 1 | 0 | 0 | 1 |
| 4 | 0 | 0 | 0 | 1 |

4th Voltage Range (5~7.5V)

|   | PT | | NT | |
|---|---|---|---|---|
|   | Enable | Direction | Enable | Direction |
| 1 | 1 | 1 | 1 | 0 |
| 2 | 1 | 0 | 1 | 1 |
| 3 | 0 | 0 | 0 | 1 |
| 4 | 0 | 0 | 0 | 1 |

2nd Voltage Range (2.5~5V)

|   | PT | | NT | |
|---|---|---|---|---|
|   | Enable | Direction | Enable | Direction |
| 1 | 1 | 0 | 1 | 1 |
| 2 | 1 | 0 | 1 | 0 |
| 3 | 1 | 0 | 0 | 1 |
| 4 | 1 | 0 | 0 | 1 |

FIG. 9

1st Voltage Range

2nd Voltage Range

CIRCUIT DEVICE, ELECTRO-OPTICAL DEVICE, AND ELECTRONIC APPARATUS

The present application is based on, and claims priority from JP Application Serial Number 2019-168934, filed Sep. 18, 2019, the disclosure of which is hereby incorporated by reference herein in its entirety.

BACKGROUND

1. Technical Field

The present disclosure relates to a circuit device, an electro-optical device, and an electronic apparatus.

2. Related Art

In switches using transistors, it has been known that feedthrough noise is generated when the switch is turned off. When a gate voltage of the transistor changes, charge discharge or charge injection occurs with respect to a source or a drain of the transistor via a parasitic capacitor of the transistor, resulting in generation of feedthrough noise. The feedthrough noise may be generated in various circuits including switches using transistors, and affects signal accuracy in the circuit.

JP-A-2016-90881 discloses a display driver including a switch using a transistor. The display driver in JP-A-2016-90881 includes a D/A converter circuit, an amplifier circuit, a switch, a capacitor driving circuit, and a capacitor circuit. The D/A converter circuit performs D/A conversion on gradation data, and outputs a D/A conversion voltage to an input node of the amplifier circuit, and the amplifier circuit drives an electro-optical panel, based on the D/A conversion voltage. Prior to the driving, the switch provided between the input node of the amplifier circuit and the capacitor circuit is turned on for a predetermined period of time. Then, the capacitor driving circuit outputs a voltage based on the gradation data to the capacitor circuit, and thus charge redistribution occurs between the capacitor circuit and a parasitic capacitor of the input node of the amplifier circuit. The charge redistribution causes the input node of the amplifier circuit to be assist-driven to the vicinity of the D/A conversion voltage, and then the D/A converter circuit outputs the D/A conversion voltage, and thus the input node of the amplifier circuit reaches the D/A conversion voltage at high speed.

A transfer gate in which a P-type transistor and an N-type transistor are coupled in parallel has been known as a switch using a transistor. When the switch is turned off, a gate voltage of the P-type transistor is set to a high level from a low level, and a gate voltage of the N-type transistor is set to the low level from the high level. Thus, it is conceivable that feedthrough noises cancel each other out by setting an equal transistor size for both of the transistors, namely, an equal parasitic capacitor for both of the transistors.

However, a parasitic capacitor between the source and a substrate and between the drain and the substrate fluctuates according to a source voltage and a drain voltage of the transistor, and a characteristic of the fluctuation is reversed between the P-type transistor and the N-type transistor. Thus, when the input voltage to the switch is high, a parasitic capacitor of the P-type transistor is greater, and when the input voltage to the switch is low, a parasitic capacitor of the N-type transistor is greater. Thus, feedthrough noises of the P-type transistor and the N-type transistor do not cancel each other out, and there is a problem that charge injection occurs when the input voltage to the switch is high, and charge discharge occurs when the input voltage to the switch is low.

For example, in JP-A-2016-90881, the input voltage of the switch is approximately the same as the D/A conversion voltage output from the D/A converter circuit. Since the voltage output from the D/A converter circuit changes according to the gradation data, feedthrough noise of the switch also changes according to the change. Such feedthrough noise affects an output of the amplifier circuit and affects a writing voltage of a pixel as a result, and may thus affect display quality.

SUMMARY

One aspect of the present disclosure relates to a circuit device that includes a transfer gate including a P-type transistor and an N-type transistor coupled in parallel between an input node and an output node, and being configured to input an input signal to the input node, and output an output signal to the output node, a charge compensation circuit coupled to the output node, and configured to perform charge discharge from the output node or charge injection into the output node, and a control circuit configured to control the charge compensation circuit, where, based on control from the control circuit, the charge compensation circuit performs the charge discharge when a voltage of the input signal is in a first voltage range at a timing at which the transfer gate is turned off, and performs the charge injection when a voltage of the input signal is in a second voltage range lower than that in the first voltage range at a timing at which the transfer gate is turned off.

BRIEF DESCRIPTION OF THE DRAWINGS

FIG. 8 is an example of a transistor size and a parasitic capacitor of a charge compensation circuit.

FIG. 9 is a diagram illustrating a second operation example in the first configuration example of the switch circuit.

DESCRIPTION OF EXEMPLARY EMBODIMENTS

Exemplary embodiments of the present disclosure will be described in detail hereinafter. Note that the exemplary embodiments described hereinafter are not intended to unjustly limit the content as set forth in the claims, and all of the configurations described in the exemplary embodiments are not always essential configuration requirements.

1. Circuit Device

Figure 1:
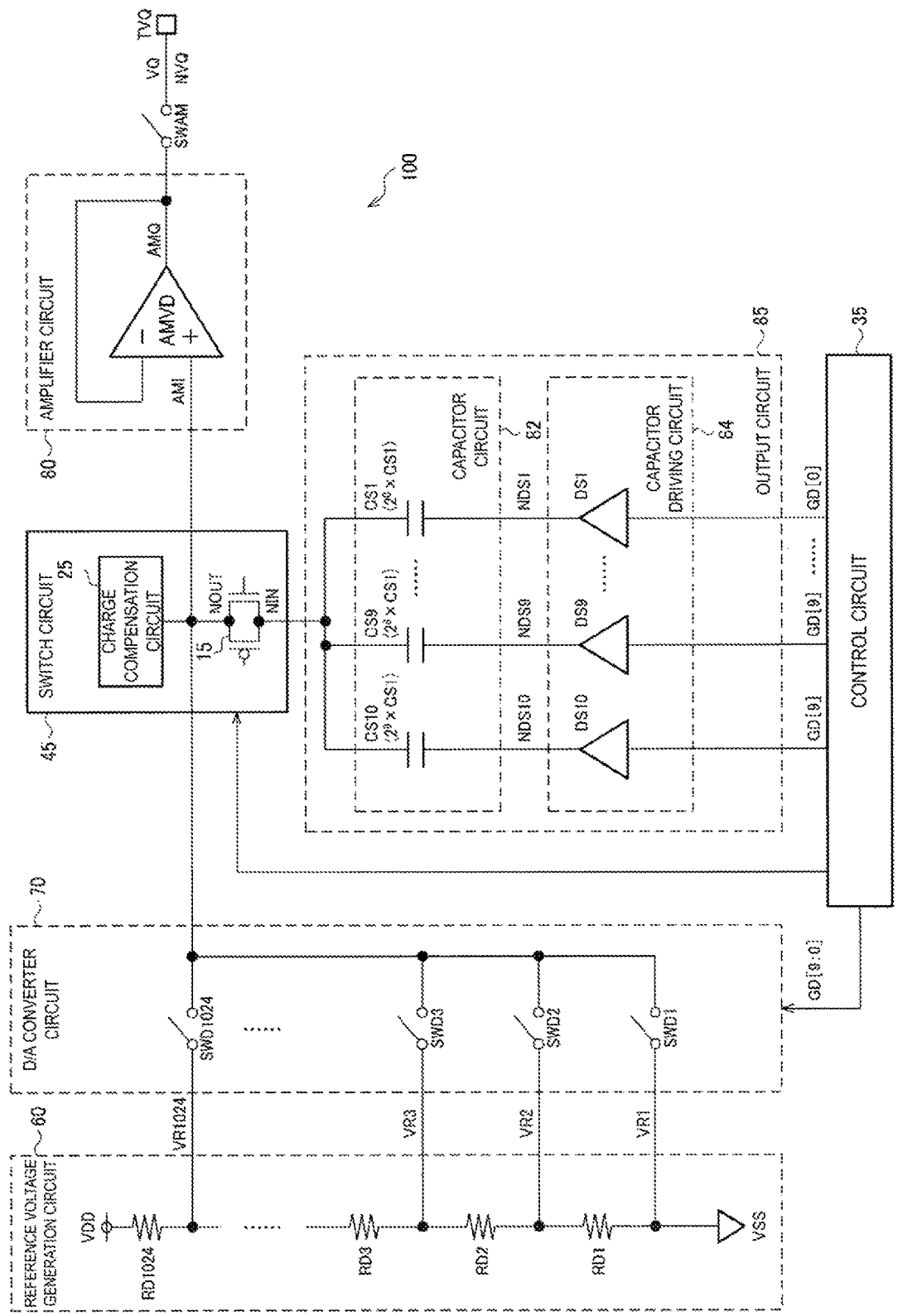
FIG. 1 is a first configuration example of a circuit device.

FIG. 1 is a first configuration example of a circuit device 100 including a switch circuit 45. The circuit device 100 includes a control circuit 35, the switch circuit 45, a reference voltage generation circuit 60, a D/A converter circuit 70, an amplifier circuit 80, an output circuit 85, and a switch SWAM. The switch circuit 45 includes a transfer gate 15 and a charge compensation circuit 25. Note that an example in which the switch circuit 45 is used as a display driver will be described here, but an application target of the switch circuit 45 is not limited thereto. For example, the switch circuit 45 can be applied to a sample hold circuit described below.

The circuit device 100 is an integrated circuit device called an integrated circuit (IC). For example, the circuit device 100 is an IC manufactured by a semiconductor process, and is a semiconductor chip in which a circuit element is formed on a semiconductor substrate.

The control circuit 35 controls ON and OFF of the transfer gate 15. Further, while the switch circuit 45 performs charge compensation for feedthrough noise as described below, the control circuit 35 controls the charge compensation. Further, the control circuit 35 outputs display data GD [9:0] to the D/A converter circuit 70 and the output circuit 85. The display data GD [9:0] are also referred to as input data. Here, it is assumed that the same data are input to the D/A converter circuit 70 and the output circuit 85, but data input to the D/A converter circuit 70 may be different from data input to the output circuit 85. In other words, data may be set such that a voltage output from the D/A converter circuit 70 and a voltage output from the output circuit 85 are approximately the same.

Based on the display data GD [9:0], the output circuit 85 outputs a data voltage corresponding to the display data GD [9:0] to an input node of the amplifier circuit 80. A signal output from the output circuit 85 is an input signal to an input node NIN of the transfer gate 15, and the input signal passes through the transfer gate 15 and is output as an output signal to an output node NOUT of the switch circuit 45. A voltage of the output signal corresponds to a data voltage output from the output circuit 85 to the input node of the amplifier circuit 80. The output circuit 85 includes a capacitor circuit 82 and a capacitor driving circuit 84.

The capacitor circuit 82 includes capacitors CS1 to CS10. The capacitor driving circuit 84 includes driving circuits DS1 to DS10. Hereinafter, i is an integer of 1 or more and 10 or less.

One end of the capacitor CSi is coupled to a capacitor driving node NDSi, and the other end of the capacitor CSi is coupled to the input node NIN of the switch circuit 45. The capacitors CS1 to CS10 each have a capacitance value weighted by a power of two. Specifically, a capacitance value of the capacitor CSi is $2^{(i-1)} \times CS1$. In this equation, CS1 indicates a capacitance value of the capacitor CS1.

A bit GD [i] of the display data GD [9:0] is input to the input node of the driving circuit DSi. The driving circuit DSi outputs a first voltage level when the bit GD [i] is at a first logic level and outputs a second voltage level when the bit GD [i] is at a second logic level. For example, the first logic level is a low level, the second logic level is a high level, the first voltage level is a voltage of a low potential side power supply VSS, and the second voltage level is a voltage of a high potential side power supply VDD. The driving circuit DSi includes a level shifter configured to level-shift the input logic level to an output voltage level of the driving circuit DSi and a buffer circuit configured to buffer the output of the level shifter.

The transfer gate 15 is a P-type transistor and an N-type transistor coupled in parallel between the input node NIN and the output node NOUT. When the transfer gate 15 is turned on, the input node NIN and the output node NOUT are coupled to each other.

The reference voltage generation circuit 60 is a circuit configured to generate a reference voltage corresponding to each value of display data. For example, the reference voltage generation circuit 60 generates reference voltages VR1 to VR1024 for 1024 gradations corresponding to 10 bits of the display data GD [9:0].

Specifically, the reference voltage generation circuit 60 includes resistors RD1 to RD1024 coupled in series between the high potential side power supply VDD and the low potential side power supply VSS. The reference voltages VR1 to VR1024 obtained by the voltage division are output from the taps of the resistors RD1 to RD1024, respectively. VR512 corresponds to a common voltage. When the amplifier circuit 80 is a non-inverting amplifier circuit, VR1 to VR512 are used in the negative polarity driving period, and VR512 to VR1024 are used in the positive polarity driving period.

The D/A converter circuit 70 selects a reference voltage corresponding to the display data GD [9:0] from among the reference voltages VR1 to VR1024, and outputs the selected reference voltage as a voltage AMI to the output node NOUT. The voltage AMI is an input voltage of the amplifier circuit 80.

Specifically, the D/A converter circuit 70 includes switches SWD1 to SWD1024, and one ends of the switches SWD1 to SWD1024 are supplied with the reference voltages VR1 to VR1024, respectively. The other ends of the switches SWD1 to SWD1024 are commonly coupled. Any one of the switches SWD1 to SWD1024 corresponding to the display data GD [9:0] is turned on, and the reference voltage supplied to the switch is output as the voltage AMI. For example, the D/A converter circuit 70 includes a decoder (not illustrated), and the decoder decodes the display data GD [9:0] and thus generates an on/off control signal for the switches SWD1 to SWD1024.

The amplifier circuit 80 amplifies the voltage AMI from the D/A converter circuit 70, and outputs the amplified voltage to a data voltage output terminal TVQ via the switch SWAM. The amplifier circuit 80 includes an operational amplifier AMVD.

The amplifier circuit 80 is a voltage follower circuit. In other words, an inverting input terminal and the output terminal of the operational amplifier AMVD are coupled to each other, and the output node NOUT of the transfer gate 15 is coupled to an non-inverting input terminal of the operational amplifier AMVD. The non-inverting input terminal of the operational amplifier AMVD is an input of the voltage follower circuit, and the voltage AMI from the D/A converter circuit 70 is input to the input of the voltage follower. Note that the amplifier circuit 80 may be an inverting amplifier circuit as described below in FIG. 19. In this case, the amplifier circuit 80 inverts the output voltage of the D/A converter circuit 70 with reference to the common voltage, but the configuration and the operation of the switch circuit 45 described below are the same as those in a case of the voltage follower circuit. Hereinafter, a case in which the amplifier circuit 80 is a voltage follower circuit will be described as an example.

The switch SWAM is configured to couple or decouple the output of the operational amplifier AMVD to or from a data voltage output node NVQ. The switch SWAM is constituted of a transistor. The on/off control signal for the switch SWAM is supplied from the control circuit 35.

Figure 2:
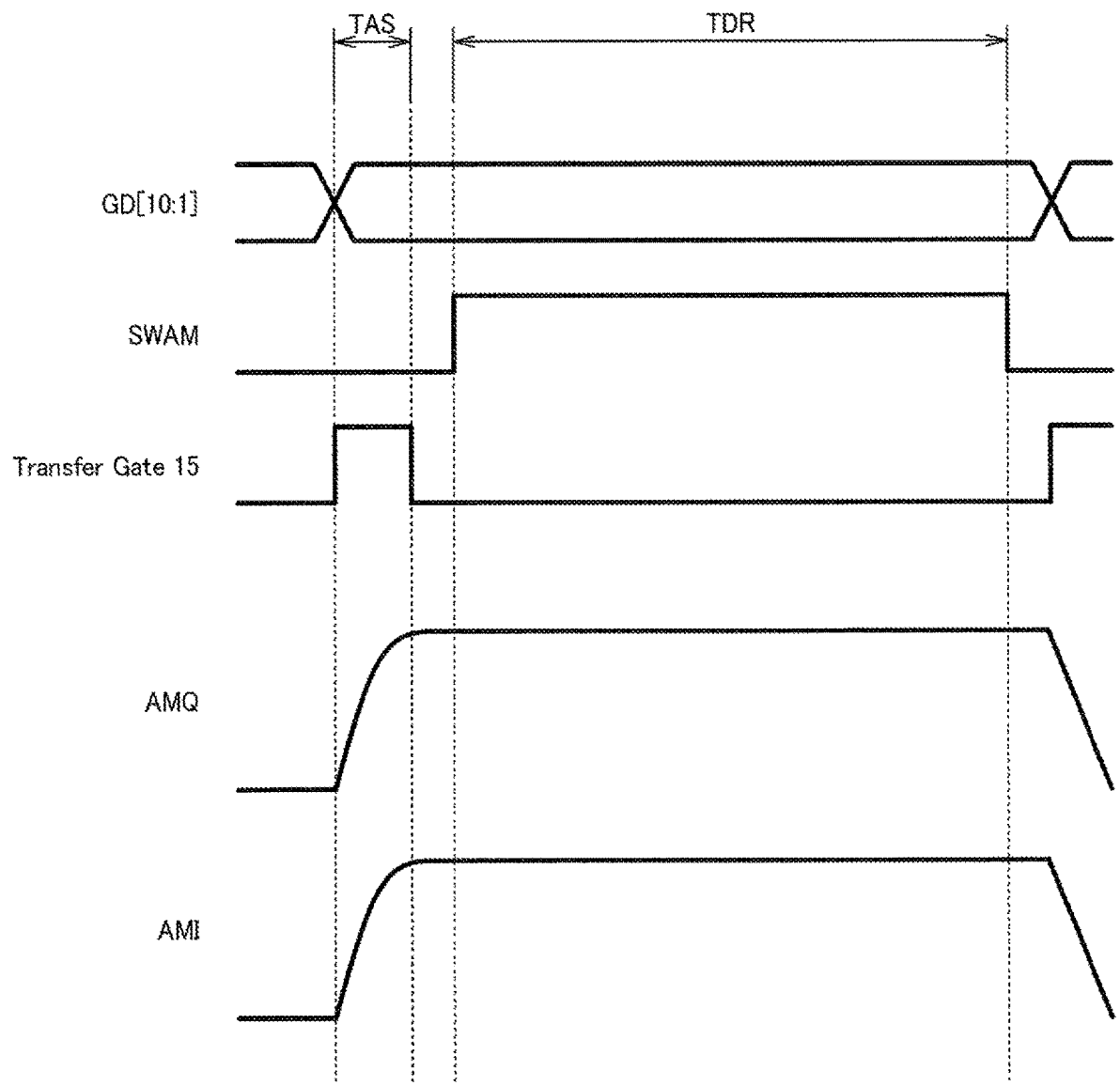
FIG. 2 is a waveform diagram illustrating an operation of the first configuration example of the circuit device.

FIG. 2 is a waveform diagram illustrating an operation of the first configuration example of the circuit device 100. FIG. 2 illustrates a waveform diagram when the amplifier circuit 80 writes one data voltage to one pixel.

During an assist period TAS, the transfer gate 15 is on, the switch SWAM is off, and the switches SWD1 to SWD1024 of the D/A converter circuit 70 are off. The input node of the amplifier circuit 80 has a parasitic capacitor, but the output circuit 85 charges the parasitic capacitor during the assist period TAS. In other words, the capacitor driving circuit 84 drives the capacitor circuit 82, and thus charge redistribution is performed between the capacitor circuit 82 and the parasitic capacitor via the transfer gate 15, and the charge redistribution causes the voltage AMI of the input node of the amplifier circuit 80 to approach the voltage corresponding to the display data GD [9:0]. At the end of the assist period TAS, the transfer gate 15 is turned off.

During a driving period TDR following the assist period TAS, the transfer gate 15 is off, the switch SWAM is on, and any of the switches SWD1 to SWD1024 of the D/A converter circuit 70 is turned on, based on the display data GD [9:0]. As a result, the D/A converter circuit 70 outputs a voltage corresponding to the display data GD [9:0] to the output node NOUT, and the amplifier circuit 80 buffers the voltage and outputs the voltage to the data voltage output node NVQ.

As described above, before the D/A converter circuit 70 outputs the D/A conversion voltage, the output circuit 85 performs assist driving, and thus a voltage of the input node of the amplifier circuit 80 is approximately the same as the D/A conversion voltage. As a result, the time required for the voltage AMI of the input node of the amplifier circuit 80 to a desired voltage is shortened since the D/A converter circuit 70 starts outputting the D/A conversion voltage, thereby enabling high-speed pixel driving.

A problem when the switch circuit 45 is simply only the transfer gate 15, that is, when a feedthrough noise reduction according to the present exemplary embodiment is not performed will be described.

In order to write an accurate data voltage to a pixel, the voltage AMI needs to be an accurate voltage at the end of the driving period TDR. At the start of the driving period TDR, the input node of the amplifier circuit 80 is approximately the voltage corresponding to the display data GD [9:0] by assist driving, but a voltage error occurs due to feedthrough noise and the like when the transfer gate 15 is turned off. From the state with the error, the D/A converter circuit 70 converges the voltage in the driving period TDR, and thus the input node of the amplifier circuit 80 is asymptotic to the voltage corresponding to the display data GD [9:0].

However, high definition of a display panel or a high frame rate of a display tends to reduce a driving period of one pixel. Thus, when an error due to feedthrough noise and the like is great, the error cannot be sufficiently converged within the driving period TDR, and the display quality deteriorates. Further, when the number of bits of display data is increased in order to enhance the gray-scale representation of the display, a small voltage error causes display unevenness. For example, although the display data are 10 bits in FIG. 1, it is assumed that 12 bits of display data are used in order to enhance the gray-scale representation. In this case, when it is assumed that a voltage amplitude of driving is set to 10V, one gradation is 2.5 mV, and the display quality deteriorates only with a remaining voltage error of approximately several mV.

For the reason described above, there is a problem that great feedthrough noise when the transfer gate 15 is turned off at the end of the assist period TAS leads to deterioration of the display quality. By using FIGS. 3 and 4, feedthrough noise generated by the transfer gate 15 will be described.

Figure 3:
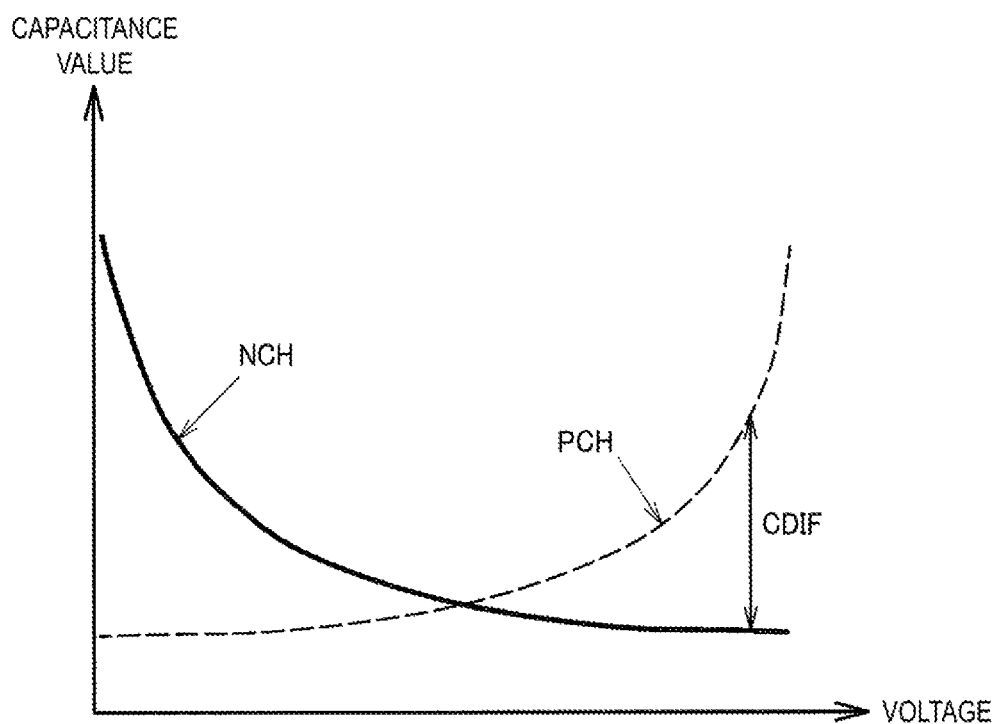
FIG. 3 is a voltage capacitance characteristic of a P-type transistor and a voltage capacitance characteristic of an N-type transistor.

FIG. 3 illustrates a voltage capacitance characteristic PCH of a P-type transistor and a voltage capacitance characteristic NCH of an N-type transistor. The horizontal axis is a source voltage or a drain voltage with reference to a substrate voltage, and the vertical axis is a capacitance value between a source and a substrate or between a drain and the substrate.

The substrate of the N-type transistor is a P type, and is set to, for example, a ground voltage. As the source voltage is farther away from the substrate voltage, that is, as the source voltage is higher, a depletion layer between the substrate and the source widens. Thus, in the voltage capacitance characteristic NCH of the N-type transistor, a capacitance value increases with a lower source voltage, and a capacitance value decreases with a higher source voltage. The same also applies to the drain.

The substrate of the P-type transistor is an N type, and is set to, for example, a power supply voltage. As the source voltage is farther away from the substrate voltage, that is, as the source voltage is lower, a depletion layer between the substrate and the source widens. Thus, in the voltage capacity characteristic PCH of the P-type transistor, a capacitance value decreases with a lower source voltage, and a capacitance value increases with a higher source voltage. The same also applies to the drain.

From the description above, even when the size of the P-type transistor and the N-type transistor is the same, there is a difference CDIF between the parasitic capacitor of the P-type transistor and the parasitic capacitor of the N-type transistor. The difference CDIF varies according to the source voltage and the drain voltage. Thus, in the transfer gate that combines the P-type transistor and the N-type transistor, an influence of the feedthrough noise varies according to the voltage.

Specifically, when a voltage of the input signal to the transfer gate is close to the power supply voltage, the parasitic capacitor of the P-type transistor is greater, and thus an influence of the positive charge output from the P-type transistor when the transfer gate is off increases. This results in charge injection as seen from the output node of the transfer gate. The charge injection refers to injection of the positive charge into the node. On the other hand, when a voltage of the input signal to the transfer gate is close to the ground voltage, the parasitic capacitor of the N-type transistor is greater, and thus an influence of the negative charge output from the N-type transistor when the transfer gate is off increases. This results in charge discharge as seen from the output node of the transfer gate. The charge discharge refers to discharge of the positive charge from the node.

Figure 4:
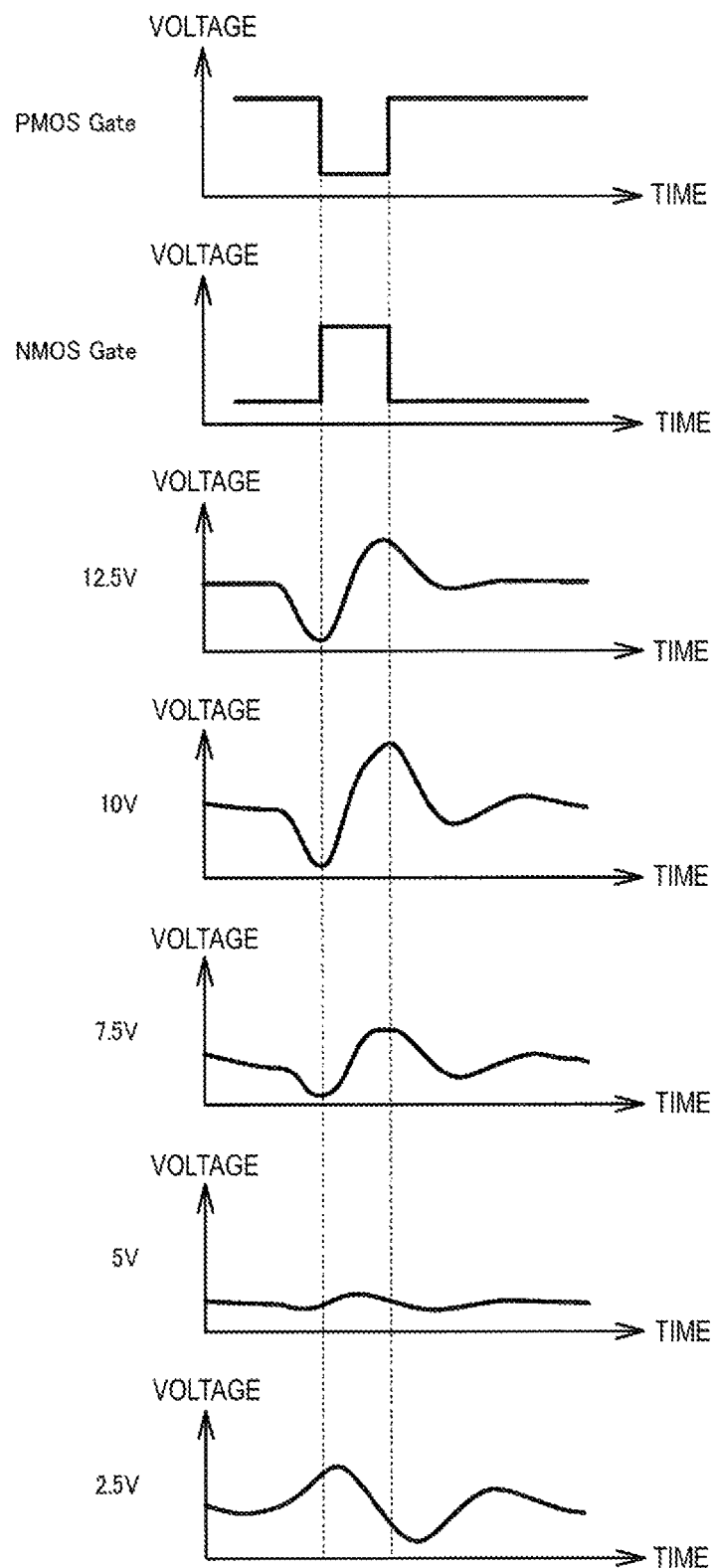
FIG. 4 is a simulation waveform of feedthrough noise generated from a transfer gate.

FIG. 4 is a simulation waveform of feedthrough noise generated from the transfer gate when charge compensation according to the present exemplary embodiment is not performed. The size of the P-type transistor and the N-type transistor is the same. FIG. 4 illustrates a signal waveform of the output node when a voltage of the input signal to the transfer gate is 12.5V, 10V, 7.5V, 5V, and 2.5V. For example, in the display driver illustrated in FIG. 1, 7.5V is a common voltage, 7.5V to 12.5V is a voltage of positive polarity driving, and 7.5V to 2.5V is a voltage of negative polarity driving.

Hereinafter, feedthrough noise when the transfer gate is turned off from on will be focused. When the transfer gate is turned off from on, the gate voltage of the P-type transistor is set to a high level from a low level, and thus the P-type transistor injects the charge into the output node. On the other hand, since the gate voltage of the N-type transistor is set to the low level from the high level, the N-type transistor discharges the charge from the output node.

When a voltage of the input signal is 12.5V, 10V, and 7.5V, the parasitic capacitor of the P-type transistor is greater than the parasitic capacitor of the N-type transistor, and thus the amount of the charge injected into the output node by the P-type transistor is greater than the amount of the charge discharged from the output node by the N-type transistor. Thus, the charge injection is performed by the entire transfer gate. When a voltage of the input signal is 5V, the amount of the charge injected into the output node by the P-type transistor and the amount of the charge discharged from the output node by the N-type transistor are substantially equal, and thus feedthrough noise is small. When a voltage of the input signal is 2.5V, the parasitic capacitor of the N-type transistor is greater than the parasitic capacitor of the P-type transistor, and thus the amount of the charge discharged from the output node by the N-type transistor is greater than the amount of the charge injected into the output node by the P-type transistor. Thus, the charge discharge is performed by the entire transfer gate.

Note that, when an electro-optical panel having a relatively high driving voltage is driven in the display driver as in FIG. 1, a high pressure resistance process is used for the driving circuit. In the transistor of the high pressure resistance process, a depletion layer between the substrate, and the source and the drain is wide in order to increase pressure resistance. Thus, a fluctuation in parasitic capacitor with respect to a voltage change in the source and the drain is greater in a high pressure resistance transistor than in a low pressure resistance transistor. In other words, the feedthrough noise described above further increases in the transfer gate by the high pressure resistance transistor.

As described above, there is a problem that feedthrough noise dependent on a voltage of the input signal in the transfer gate 15 is generated. In other words, there is a problem that the amount of charge of feedthrough noise changes according to a voltage of the input signal, and charge discharge and charge injection are also switched. The present exemplary embodiment that can solve such a problem will be described below.

2. First Configuration Example of Switch Circuit

Figure 5:
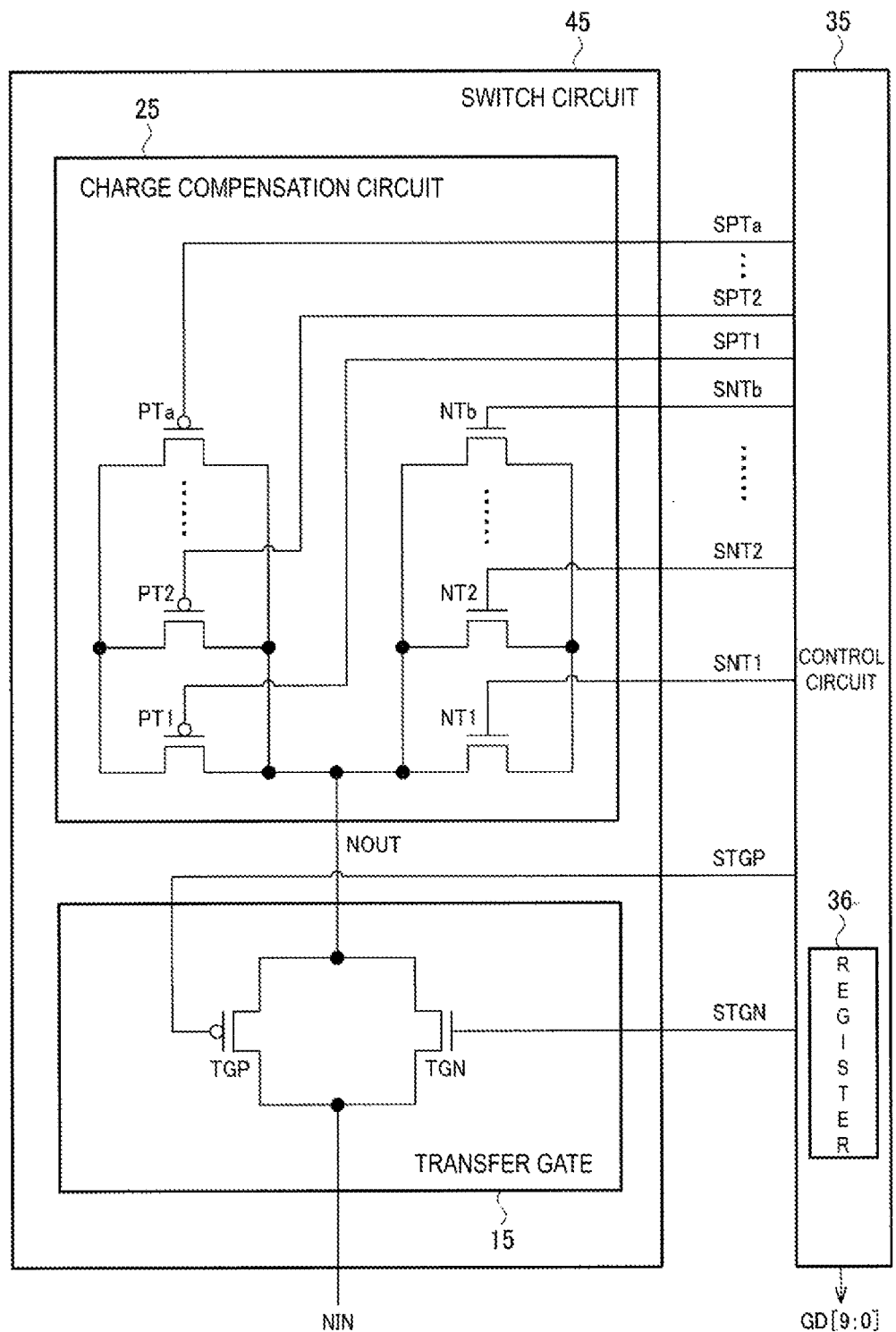
FIG. 5 is a first configuration example of a switch circuit.

FIG. 5 is a first configuration example of the switch circuit 45. The switch circuit 45 includes the transfer gate 15 and the charge compensation circuit 25.

The transfer gate 15 includes a P-type transistor TGP and an N-type transistor TGN coupled in parallel between the input node NIN and the output node NOUT. In other words, one of a source and a drain of the P-type transistor TGP and one of a source and a drain of the N-type transistor TGN are coupled to the input node NIN. The other of the source and the drain of the P-type transistor TGP and the other of the source and the drain of the N-type transistor TGN are coupled to the output node NOUT. The input signal is input to the input node NIN of the transfer gate 15. When the transfer gate 15 is on, the transfer gate 15 passes the input signal and outputs the output signal to the output node NOUT. The gate size of the P-type transistor TGP and the N-type transistor TGN is the same, which is not limited thereto.

The charge compensation circuit 25 is coupled to the output node NOUT. The charge compensation circuit 25 performs charge discharge from the output node NOUT or charge injection into the output node NOUT. Specifically, the charge compensation circuit 25 performs the charge discharge when a voltage of the input signal is in a first voltage range at a timing at which the transfer gate 15 is turned off. The charge compensation circuit 25 performs the charge injection when a voltage of the input signal is in a second voltage range lower than the first voltage range at the timing at which the transfer gate 15 is turned off.

The first voltage range is a voltage range of 5V to 12.5V higher than 5V in the example in FIG. 4, for example. In other words, the first voltage range is a voltage range in which charge is injected into the output node NOUT when the transfer gate 15 is turned off. Further, the second voltage range is a voltage range of 5V to 2.5V lower than 5V in the example in FIG. 4, for example. In other words, the second voltage range is a voltage range in which charge is discharged from the output node NOUT when the transfer gate 15 is turned off. Note that the first voltage range and the second voltage range may be arbitrarily set. For example, 7.5V to 12.5V higher than the common voltage of 7.5V may be set to be the first voltage range, and 7.5V to 2.5V lower than the common voltage of 7.5V may be set to be the second voltage range.

According to the present exemplary embodiment, when a voltage of the input signal is in the first voltage range, feedthrough noise due to the charge injection of the transfer gate 15 can be reduced by the charge compensation circuit 25 performing the charge discharge. Further, when a voltage of the input signal is in the second voltage range, feedthrough noise due to the charge discharge of the transfer gate 15 can be reduced by the charge compensation circuit 25 performing the charge injection. As a result, feedthrough noise dependent on a voltage of the input signal can be reduced.

A detailed configuration of the charge compensation circuit 25 in the first configuration example will be described. The charge compensation circuit 25 includes a transistor group. The transistor group includes P-type transistors PT1 to PTa that are a P-type transistor group, and N-type transistors NT1 to NTb that are an N-type transistor group. a and b are an integer equal to or greater than 2. A source and a drain of the P-type transistors PT1 to PTa and a source and a drain of the N-type transistors NT1 to NTb are coupled to the output node NOUT of the transfer gate 15. For example, the gate size of the P-type transistors PT1 to PTa may be the same or may be different from each other. For example, the gate size of the P-type transistors PT1 to PTa may be weighted by a binary, or the gate size of the P-type transistors PT1 to PTa may be increased by a predetermined step. What kind of a gate size is adopted may be set according to a control technique of charge compensation and resolution of charge compensation. The same also applies to the gate size of the N-type transistors NT1 to NTb. Note that while FIG. 5 illustrates a case in which the charge compensation circuit 25 includes the P-type transistor group and the N-type transistor group, the charge compensation circuit 25 may include only one of the P-type transistor group and the N-type transistor group.

The control circuit 35 controls the transfer gate 15 and the charge compensation circuit 25. Specifically, the control circuit 35 controls on and off of the transfer gate 15 by outputting a control signal STGP to the P-type transistor TGP and outputting a control signal STGN to the N-type transistor TGN. The control circuit 35 also includes a register 36 configured to store setting information about charge compensation. The setting information is information that designates a transistor to be turned on and off in charge compensation, and information that designates whether the transistor is switched from on to off or off to on. The control circuit 35 controls the charge compensation circuit 25 by outputting a control signal group to the transistor group of the charge compensation circuit 25, based on the setting information stored in the register 36. In other words, the control circuit 35 outputs control signals SPT1 to SPTa to a gate of the P-type transistors PT1 to PTa, and outputs control signals SNT1 to SNTb to a gate of the N-type transistors NT1 to NTb.

The control circuit 35 determines a voltage range to which a voltage of the input signal belongs, based on the display data GD [9:0] output to the output circuit 85. Since the output circuit 85 outputs a voltage corresponding to the display data GD [9:0] to the input node NIN of the transfer gate 15, the control circuit 35 can determine a voltage of the input signal from the display data GD [9:0].

When a voltage of the input signal of the transfer gate 15 is in the first voltage range, the control circuit 35 sets one or the plurality of control signals SPT1 to SPTa and SNT1 to SNTb from the high level to the low level at the timing at which the transfer gate 15 is turned off. In other words, the control circuit 35 turns one or the plurality of P-type transistors in the P-type transistor group of the charge compensation circuit 25 from on to off, or turns one or the plurality of N-type transistors in the N-type transistor group of the charge compensation circuit 25 from off to on. As a result, the charge compensation circuit 25 discharges charge from the output node NOUT.

On the other hand, when a voltage of the input signal of the transfer gate 15 is in the second voltage range, the control circuit 35 sets one or the plurality of control signals SPT1 to SPTa and SNT1 to SNTb from the low level to the high level at the timing at which the transfer gate 15 is turned off. In other words, the control circuit 35 turns one or the plurality of P-type transistors in the P-type transistor group of the charge compensation circuit 25 from off to on, or turns one or the plurality of N-type transistors in the N-type transistor group of the charge compensation circuit 25 from on to off. As a result, the charge compensation circuit 25 injects charge into the output node NOUT.

Note that control for setting one or the plurality of control signals from the high level to the low level and control for setting one or the plurality of control signals from the low level to the high level may be mixed. In other words, on and off of the transistor group may be controlled such that the charge discharge or the charge injection is performed by the entire transistor group. A specific control example will be described below.

Figure 6:
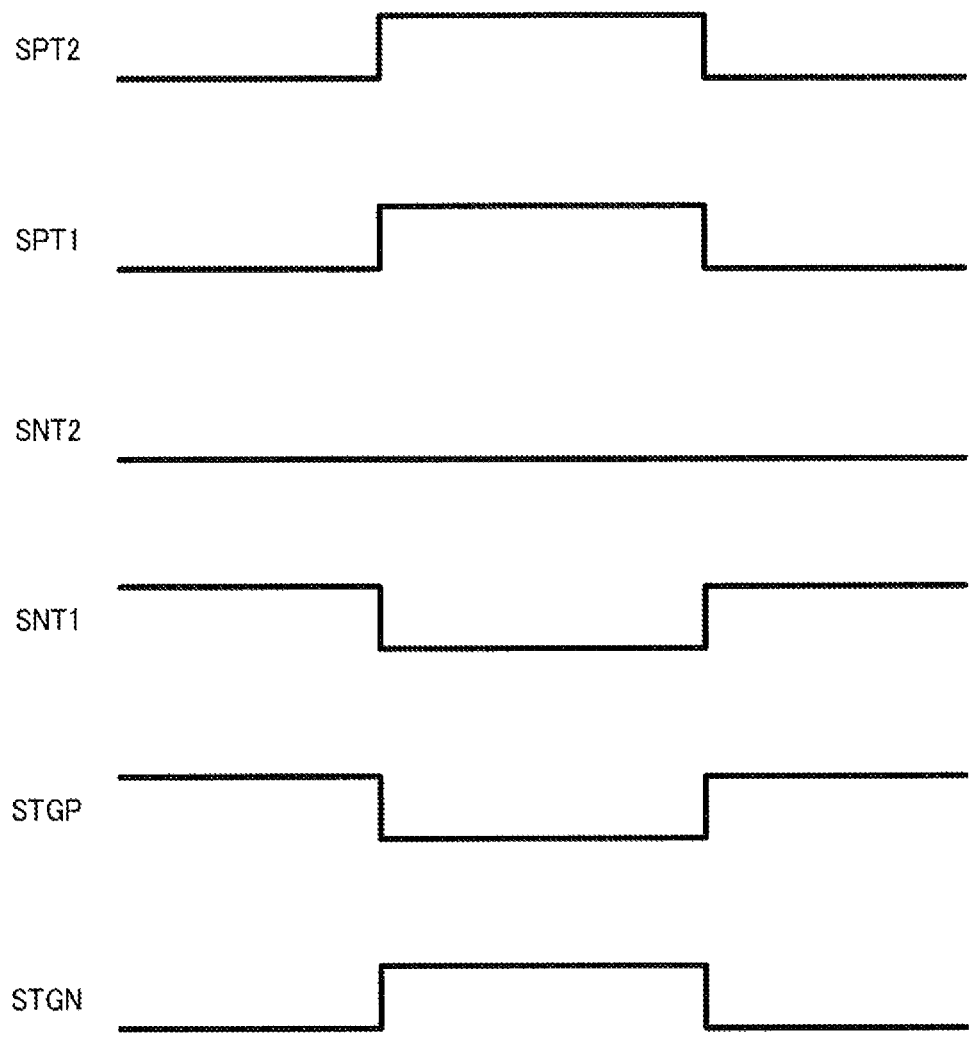
FIG. 6 is a waveform diagram illustrating a first operation example in the first configuration example of the switch circuit.
Figure 7:
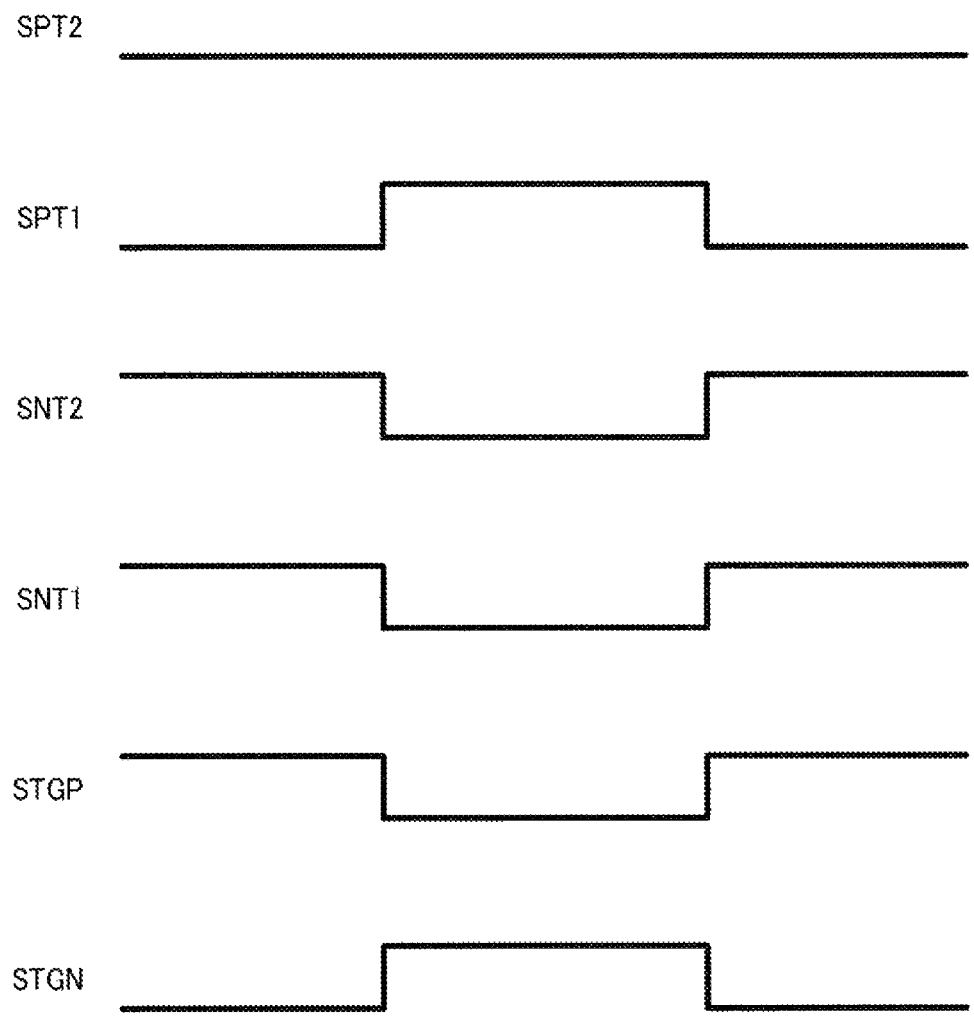
FIG. 7 is a waveform diagram illustrating the first operation example in the first configuration example of the switch circuit.

FIGS. 6 and 7 are each a waveform diagram illustrating a first operation example in the first configuration example of the switch circuit 45. Here, it is assumed that the first voltage range is set to 7.5V to 12.5V, the second voltage range is set to 7.5V to 2.5V, a=b=2, and the transistor size of the transistors PT1, PT2, NT1, and NT2 is the same. For example, the total transistor size of the P-type transistors PT1 and PT2 is approximately half of the transistor size of the P-type transistor TGP of the transfer gate 15. Further, the total transistor size of the N-type transistors NT1 and NT2 is approximately half of the transistor size of the N-type transistor TGN of the transfer gate 15.

FIG. 6 illustrates a waveform example when a voltage of the input signal of the transfer gate 15 in the first configuration example is in the first voltage range. When the transfer gate 15 is turned off from on by the control signals STGP and SIGN, the control circuit 35 sets the control signals SPT1 and SPT2 of the P-type transistors PT1 and PT2 from the high level to the low level, and sets the control signal SNT1 of the N-type transistor NT1 from the low level to the high level. The logic level of the control signal SNT2 of the N-type transistor NT2 does not change. In this way, the amount of charge discharged from the output node NOUT by the P-type transistors PT1 and PT2 is greater than the amount of charge injected into the output node NOUT by the N-type transistor NT1, and thus the charge discharge is performed as a whole.

FIG. 7 illustrates a waveform example when a voltage of the input signal of the transfer gate 15 in the first configuration example is in the second voltage range. When the transfer gate 15 is turned off from on by the control signals STGP and SIGN, the control circuit 35 sets the control signal SPT1 of the P-type transistor PT1 from the high level to the low level, and sets the control signals SNT1 and SNT2 of the N-type transistors NT1 and NT2 from the low level to the high level. The logic level of the control signal SNT2 of the N-type transistor NT2 does not change. In this way, the amount of charge injected into the output node NOUT by the N-type transistors NT1 and NT2 is greater than the amount of charge discharged from the output node NOUT by the P-type transistor PT1, and thus the charge injection is performed as a whole.

FIG. 8 is an example of a transistor size and a parasitic capacitor of the charge compensation circuit 25. Here, it is assumed that a=b=4. FIG. 8 illustrates a gate width W as the transistor size. A gate length L of the transistors PT1 to PT4 and NT1 to NT4 is the same. A parasitic capacitor at 7.5V is a parasitic capacitor that occurs between the gate, and the source and the drain when a voltage of the source and the drain is 7.5V. A parasitic capacitor at 12.5V is a parasitic capacitor that occurs between the gate, and the source and the drain when a voltage of the source and the drain is 12.5V.

FIG. 9 is a diagram illustrating a second operation example in the first configuration example of the switch circuit 45. FIG. 9 illustrates an example of a register setting value stored in the register 36. The transistor size and the parasitic capacitor are as illustrated in FIG. 8. Here, it is assumed that the first voltage range is set to 10 to 12.5V, a third voltage range is set to 7.5 to 10V, a fourth voltage range is set to 5 to 7.5V, and the second voltage range is set to 2.5 to 5V. Note that the third voltage range may be a voltage range lower than the first voltage range and higher than the second voltage range, and the fourth voltage range may be a voltage range lower than the third voltage range and higher than the second voltage range.

As illustrated in FIG. 9, register values are Enable and Direction, and the register values are set so as to correspond to each transistor. Enable indicates whether or not the transistor is switched between on and off when the transfer gate 15 is turned off. Enable=1 indicates that the operation is enabled, that is, the transistor is switched between on and off. Direction indicates whether the control signal of the transistor transitions from the low level to the high level or transitions from the high level to the low level when the transfer gate 15 is turned off. Direction=1 indicates that the control signal of the transistor transitions from the low level to the high level.

An operation will be described with the third voltage range as an example. In the third voltage range, it is assumed that a parasitic capacitor of the transistor is the "parasitic capacitor at 7.5V" in FIG. 8. In the third voltage range, the control signal of the transistors PT1 and NT2 is set from the low level to the high level, and the control signal of the transistors PT3 and NT1 is set from the high level to the low level. Since a difference between the parasitic capacitors is 6.0 fF+6.8 fF−(8.0 fF+6.0 fF)=−1.2 fF from FIG. 8, charge corresponding to 1.2 fF will be discharged from the output node NOUT of the transfer gate 15. For example, it is assumed that, in FIG. 1, a parasitic capacitor of the input node of the amplifier circuit 80 is 3 pF and the transistor of the charge compensation circuit 25 is turned on and off at an amplitude of 15V. In this case, the charge compensation circuit 25 can modify a voltage of the input node of the amplifier circuit 80 by (1.2 fF×15V)/3 pF=6 mV. In other words, feedthrough noise generated by the transfer gate 15 can be compensated for by 6 mV.

Similarly, in the first voltage range, it is assumed that a parasitic capacitor of the transistor is the "parasitic capacitor at 12.5V" in FIG. 8. In the first voltage range, the control signal of the transistors PT1 and NT2 is set from the low level to the high level, and the control signal of the transistors PT4 and NT1 is set from the high level to the low level. Since a difference between the parasitic capacitors is 11.0 fF+4.5 fF−(16.5 fF+4.0 fF)=−5.0 fF from FIG. 8, charge corresponding to 5.0 fF will be discharged from the output node NOUT of the transfer gate 15. For example, it is assumed that, in FIG. 1, a parasitic capacitor of the input node of the amplifier circuit 80 is 3 pF and the transistor of the charge compensation circuit 25 is turned on and off at an amplitude of 15V. In this case, feedthrough noise generated by the transfer gate 15 can be compensated for by (5.0 fF×15V)/3 pF=25 mV.

As described above, in the transistor group of the charge compensation circuit 25, by various combinations of transistors to be turned on and off when the transfer gate 15 is turned off and on/off directions, feedthrough noise dependent on a voltage of the input signal can be appropriately compensated for. Specifically, as the voltage range of the higher voltage is set, the amount of discharged charge of the charge compensation circuit 25 increases. As a result, feedthrough noise that increases with a higher voltage of the input signal can be appropriately compensated for.

The operation in the voltage range higher than 7.5V is described above, but the following operation is performed in the second and fourth voltage ranges lower than 7.5V. In other words, in the second voltage range, the control signal of the transistor NT1 is set from the low level to the high level, and the control signal of the transistors PT1 to PT4 and NT2 is set from the high level to the low level. In the fourth voltage range, the control signal of the transistors PT1 and NT2 is set from the low level to the high level, and the control signal of the transistors PT2 and NT1 is set from the high level to the low level. Although a specific numerical value is not illustrated, in the voltage range lower than 7.5V, as the voltage range of the lower voltage is set, the amount of injected charge of the charge compensation circuit 25 increases. As a result, feedthrough noise that increases with a lower voltage of the input signal can be appropriately compensated for.

3. Second and Third Configuration Examples of Switch Circuit

Figure 10:
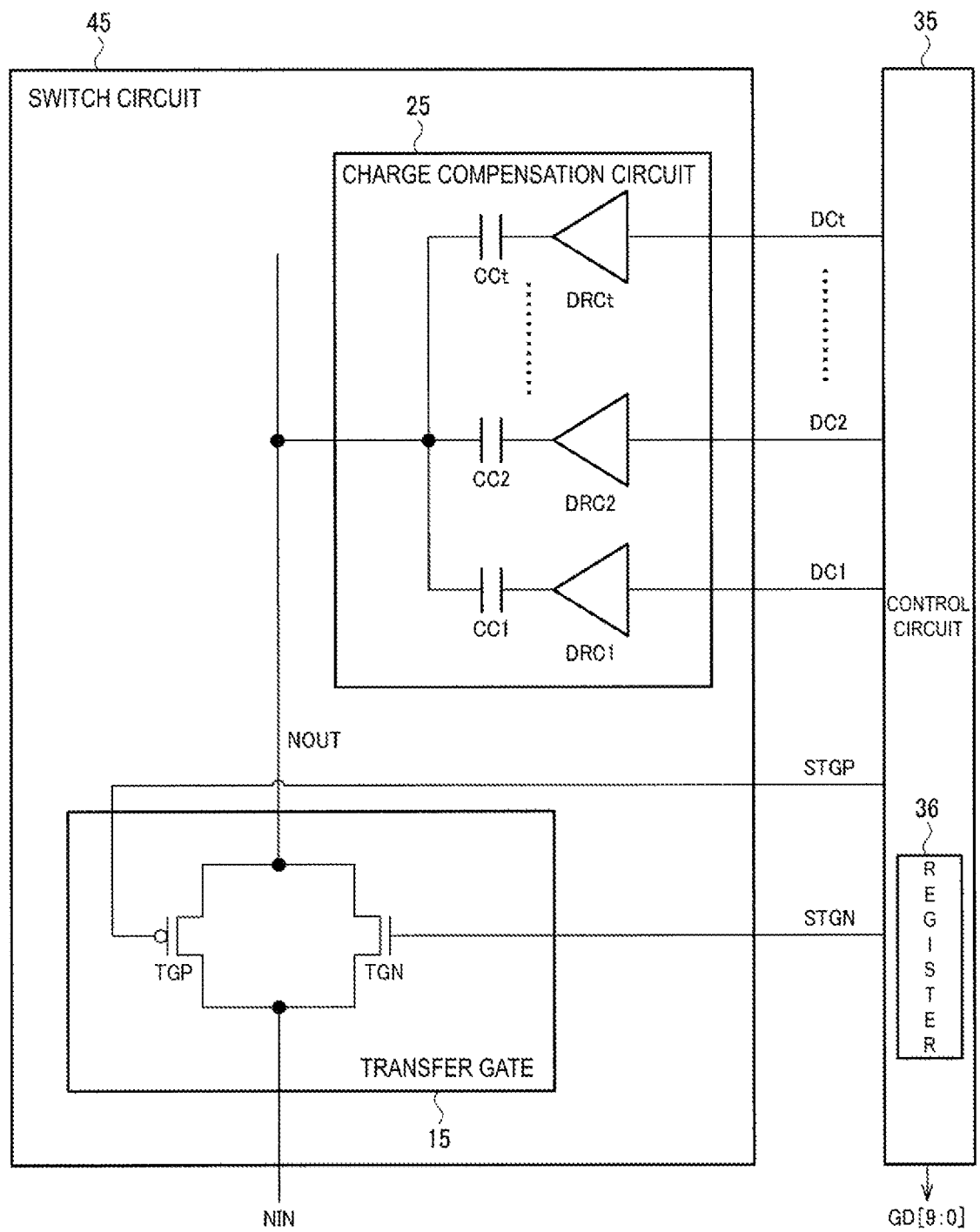
FIG. 10 is a second configuration example of the switch circuit.

FIG. 10 is a second configuration example of the switch circuit 45. The switch circuit 45 includes the transfer gate 15 and the charge compensation circuit 25. A configuration of the transfer gate 15 is the same as that in the first configuration example.

The charge compensation circuit 25 includes capacitors CC1 to CCt that are a capacitor group, and driving circuits DRC1 to DRCt that are a driving circuit group. t is an integer equal to or greater than 2.

One end of the capacitors CC1 to CCt is coupled to the output node NOUT of the transfer gate 15. The other end of the capacitors CC1 to CCt is coupled to the output node of the driving circuits DRC1 to DRCt. The capacitors CC1 to CCt are, for example, an MIM capacitor. A capacitance value of the capacitors CC1 to CCt may be the same or may be different from each other. For example, the capacitance value of the capacitors CC1 to CCt may be weighted by a binary, or the capacitance value of the capacitors CC1 to CCt may be increased by a predetermined step. What kind of a capacitance value is adopted may be set according to a control technique of charge compensation and resolution of charge compensation.

Control signals DC1 to DCt are input from the control circuit 35 to the input node of the driving circuits DRC1 to DRCt. The driving circuits DRC1 to DRCt drive the other end of the capacitors CC1 to CCt, based on the control signals DC1 to DCt. For example, when the control circuit 35 sets the control signal DC1 from the high level to the low level, the driving circuit DRC1 changes the other end of the capacitor CC1 from a first voltage to a second voltage. When the control circuit 35 sets the control signal DC1 from the low level to the high level, the driving circuit DRC1 changes the other end of the capacitor CC1 from the second voltage to the first voltage. The first voltage is, for example, the power supply voltage. The second voltage is lower than the first voltage, and is, for example, the ground voltage. The driving circuits DRC2 to DRCt also operate in a similar manner.

Figure 11:
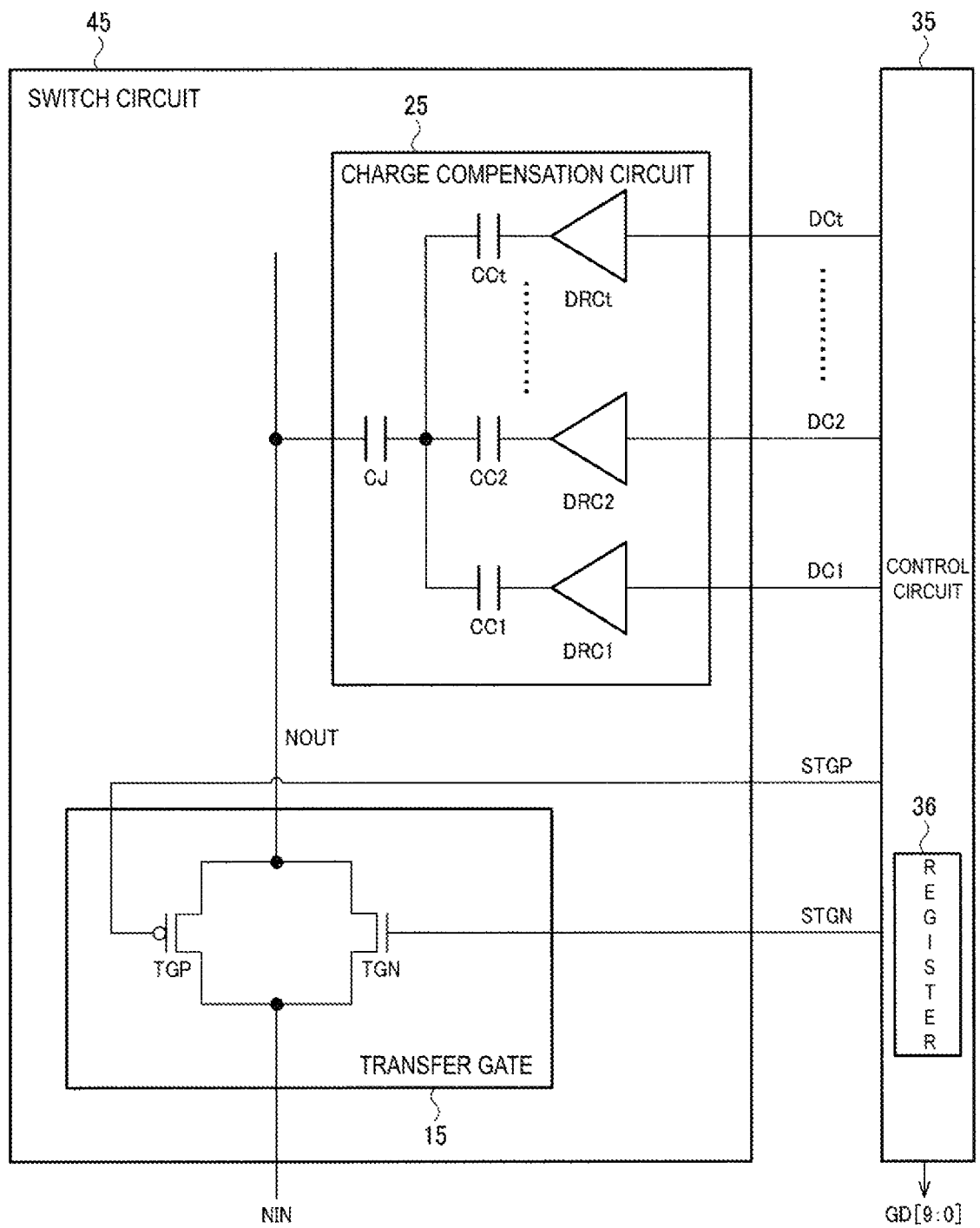
FIG. 11 is a third configuration example of the switch circuit.

FIG. 11 is a third configuration example of the switch circuit 45. The switch circuit 45 includes the transfer gate 15 and the charge compensation circuit 25. A configuration of the transfer gate 15 is the same as that in the first configuration example.

The charge compensation circuit 25 includes a capacitor CJ, capacitors CC1 to CCt that are a capacitor group, and driving circuits DRC1 to DRCt that are a driving circuit group. t is an integer equal to or greater than 2.

One end of the capacitor CJ is coupled to the output node NOUT of the transfer gate 15. The other end of the capacitor CJ is coupled to one end of the capacitors CC1 to CCt. The other end of the capacitors CC1 to CCt is coupled to the output node of the driving circuits DRC1 to DRCt. The capacitor CJ and the capacitors CC1 to CCt are, for example, an MIM capacitor. Control signals DC1 to DCt are input from the control circuit 35 to the input node of the driving circuits DRC1 to DRCt. The driving circuits DRC1 to DRCt drive the other end of the capacitors CC1 to CCt, based on the control signals DC1 to DCt. An operation of the charge compensation circuit 25 is similar to that in the second configuration example. However, in the second configuration example, the capacitor CJ is coupled in series between the capacitors CC1 to CCt and the output node NOUT, and thus the amount of charge movement when the driving circuits CC1 to CCt drive the other end of the capacitors CC1 to CCt is smaller than in the first configuration example.

Figure 12:
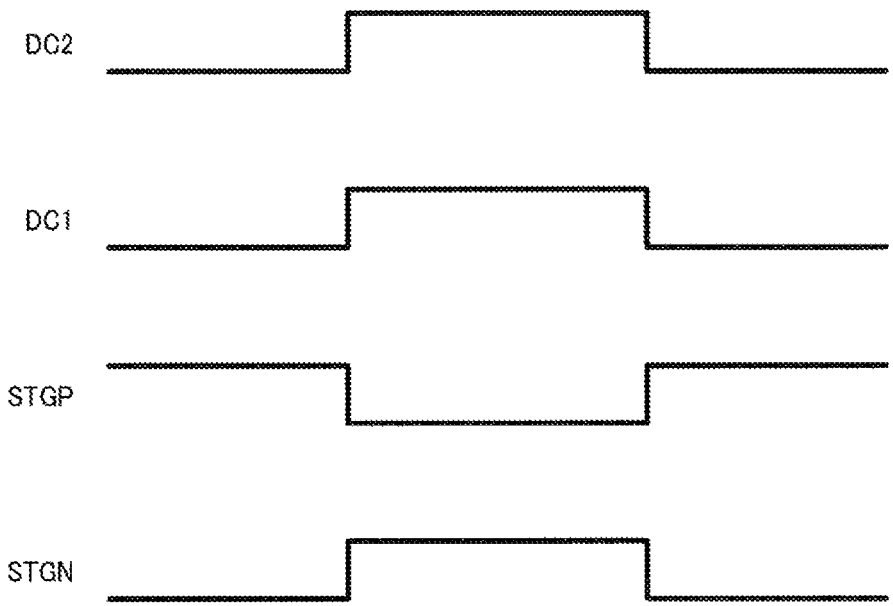
FIG. 12 is a waveform diagram illustrating an operation in a second configuration example of the switch circuit.
Figure 13:
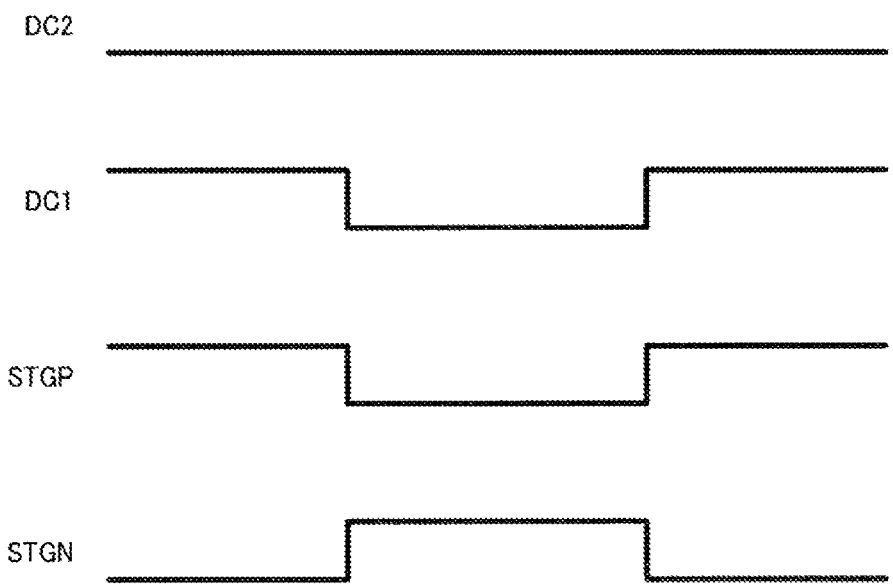
FIG. 13 is a waveform diagram illustrating an operation in the second configuration example of the switch circuit.

FIGS. 12 and 13 are each a waveform diagram illustrating an operation in the second and third configuration examples of the switch circuit 45. Here, it is assumed that t=2. Further, a first voltage and a second voltage output from the driving circuits DRC1 and DRC2 are also referred to as a high level and a low level, respectively.

FIG. 12 illustrates a waveform example when a voltage of the input signal of the transfer gate 15 is in the first voltage range in the second and third configuration examples. The driving circuits DRC1 and DRC2 change a voltage at the other end of one or the plurality of capacitors CC1 and CC2 from the high level to the low level at the timing at which the transfer gate 15 is turned off. As a result, the charge compensation circuit 25 discharges charge from the output node NOUT of the transfer gate 15. In the waveform example in FIG. 12, the control circuit 35 changes the control signals DC1 and DC2 from the high level to the low level, and the driving circuits DRC1 and DRC2 change the voltage at the other end of the capacitors CC1 and CC2 from the high level to the low level.

FIG. 13 illustrates a waveform example when the voltage of the input signal of the transfer gate 15 is in the second voltage range in the second and third configuration examples. The driving circuits DRC1 and DRC2 change a voltage at the other end of one or the plurality of capacitors CC1 and CC2 from the low level to the high level at the timing at which the transfer gate 15 is turned off. As a result, the charge compensation circuit 25 injects charge into the output node NOUT of the transfer gate 15. In the waveform example in FIG. 13, the control circuit 35 changes the control signal DC1 from the low level to the high level, and the driving circuit DRC1 changes the voltage at the other end of the capacitor CC1 from the low level to the high level.

Note that, similarly to the first configuration example, control for setting one or the plurality of control signals from the high level to the low level and control for setting one or the plurality of control signals from the low level to the high level may be mixed. In other words, driving of the capacitor group by the driving circuit group may be controlled such that the charge compensation circuit 25 as a whole performs the charge discharge or the charge injection. For example, it is assumed that a capacitance value of the capacitor CC1 is 5 fF, and a capacitance value of the capacitor CC2 is 7 fF. In this case, when the driving circuit DRC1 drives the other end of the capacitor CC1 from the low level to the high level, and the driving circuit DRC2 drives the other end of the capacitor CC2 from the high level to the low level, the charge compensation circuit 25 as a whole performs the charge discharge corresponding to 2 fF.

Further, in the second and third configuration examples, the register 36 stores setting information about charge compensation. The setting information is information that designates a driving circuit for driving a capacitor in charge compensation, and information that designates whether the driving circuit changes the other end of the capacitor from the low level to the high level or from the high level to the low level. The control circuit 35 outputs the control signals DC1 to DCt to the driving circuits DRC1 to DRCt, based on the setting information stored in the register 36.

Further, although the case in which the first and second voltage ranges are set has been described as an example in FIGS. 12 and 13, the first to fourth voltage ranges may also be set in the second and third configuration examples similarly to the first configuration example. An order of the first, third, fourth, and second voltage ranges is set from the high voltage. The amount of charge discharged by the charge compensation circuit 25 in the first voltage range is greater than the amount of charge discharged by the charge compensation circuit 25 in the third voltage range. Further, the amount of charge injected by the charge compensation circuit 25 in the second voltage range is greater than the amount of charge injected by the charge compensation circuit 25 in the fourth voltage range.

4. Second Configuration Example of Circuit Device

Figure 14:
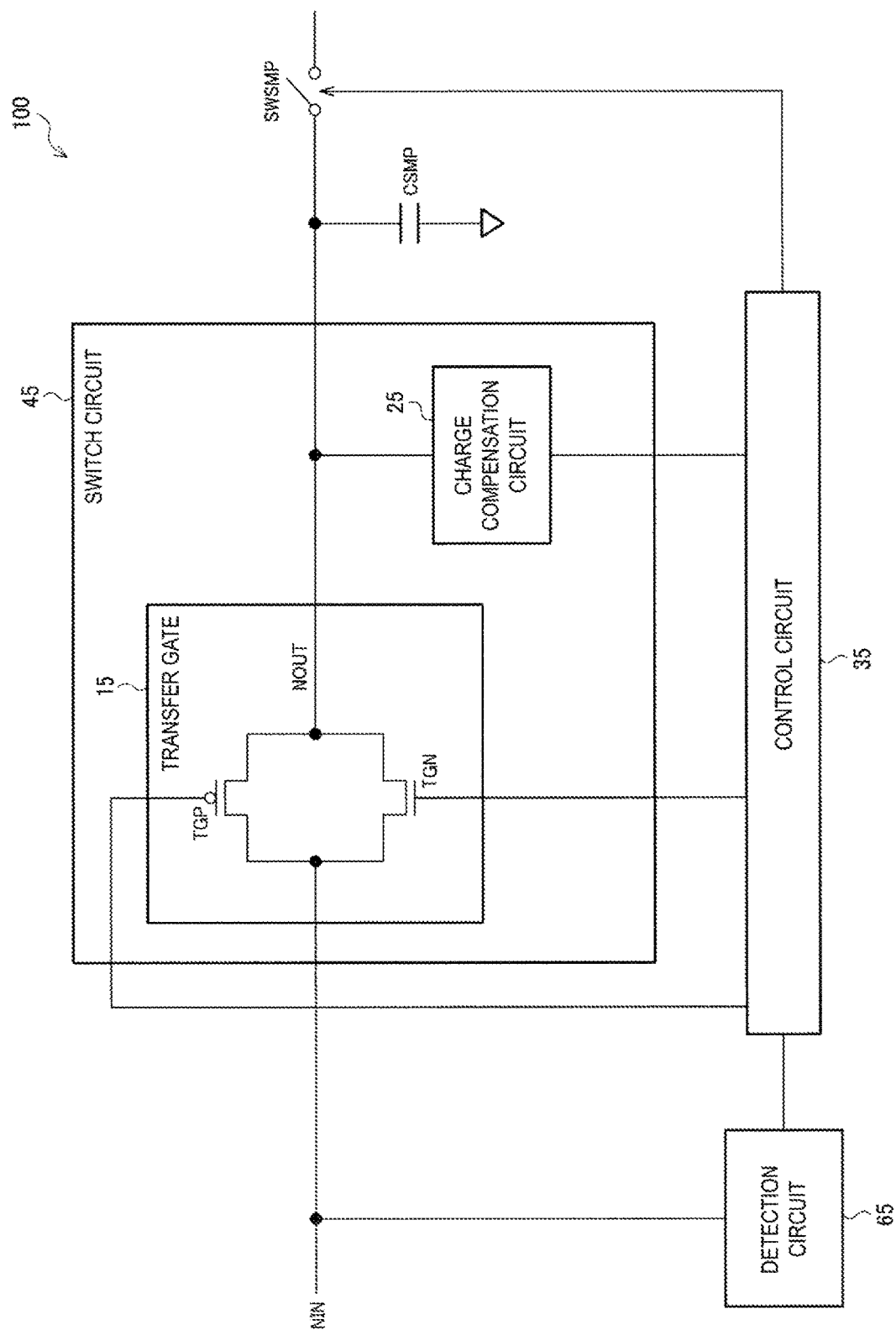
FIG. 14 is a second configuration example of the circuit device.

Although the case in which the switch circuit 45 is applied to the display driver has been described above as an example, the switch circuit 45 can be applied to various circuit devices. As one example, FIG. 14 illustrates a second configuration example of the circuit device 100. In the second configuration example, the switch circuit 45 is applied to the sample hold circuit. The sample hold circuit is used in, for example, an input unit of an A/D converter circuit or an input unit of a switched capacitor filter.

The circuit device 100 illustrated in FIG. 14 includes the control circuit 35, the switch circuit 45, a detection circuit 65, a capacitor CSMP, and a switch SWSMP. The switch circuit 45 includes the transfer gate 15 and the charge compensation circuit 25. The switch circuit 45 may be any of the first to third configuration examples described above.

During a sampling period, the control circuit 35 turns on the transfer gate 15 and turns off the switch SWSMP. As a result, the input signal input to the input node NIN of the transfer gate 15 is sampled by the capacitor CSMP coupled to the output node NOUT of the transfer gate 15. During a hold period, the control circuit 35 turns off the transfer gate 15 and turns on the switch SWSMP. As a result, the input signal is held by the capacitor CSMP, and the held signal is output via the switch SWSMP.

The charge compensation circuit 25 compensates for charge of feedthrough noise generated by the transfer gate 15 when the transfer gate 15 is turned off, that is, at a timing at which a hold voltage of the capacitor CSMP is fixed. The compensation operation is similar to that in the first to third configuration examples of the switch circuit 45.

The detection circuit 65 detects a voltage range to which a voltage of the input signal input to the input node NIN belongs. For example, the detection circuit 65 is a comparator that compares the voltage of the input signal with a reference voltage for detecting the voltage range. The control circuit 35 outputs a control signal group to the charge compensation circuit 25 according to the voltage range detected by the detection circuit 65. The charge compensation circuit 25 compensates for charge of feedthrough noise, based on the control signal group.

5. Calibration

Calibration of charge compensation will be described. For example, during initialization when the power of the circuit device 100 is turned on, the circuit device 100 performs calibration, and stores, in the register 36, the result as setting information about charge compensation.

Figure 15:
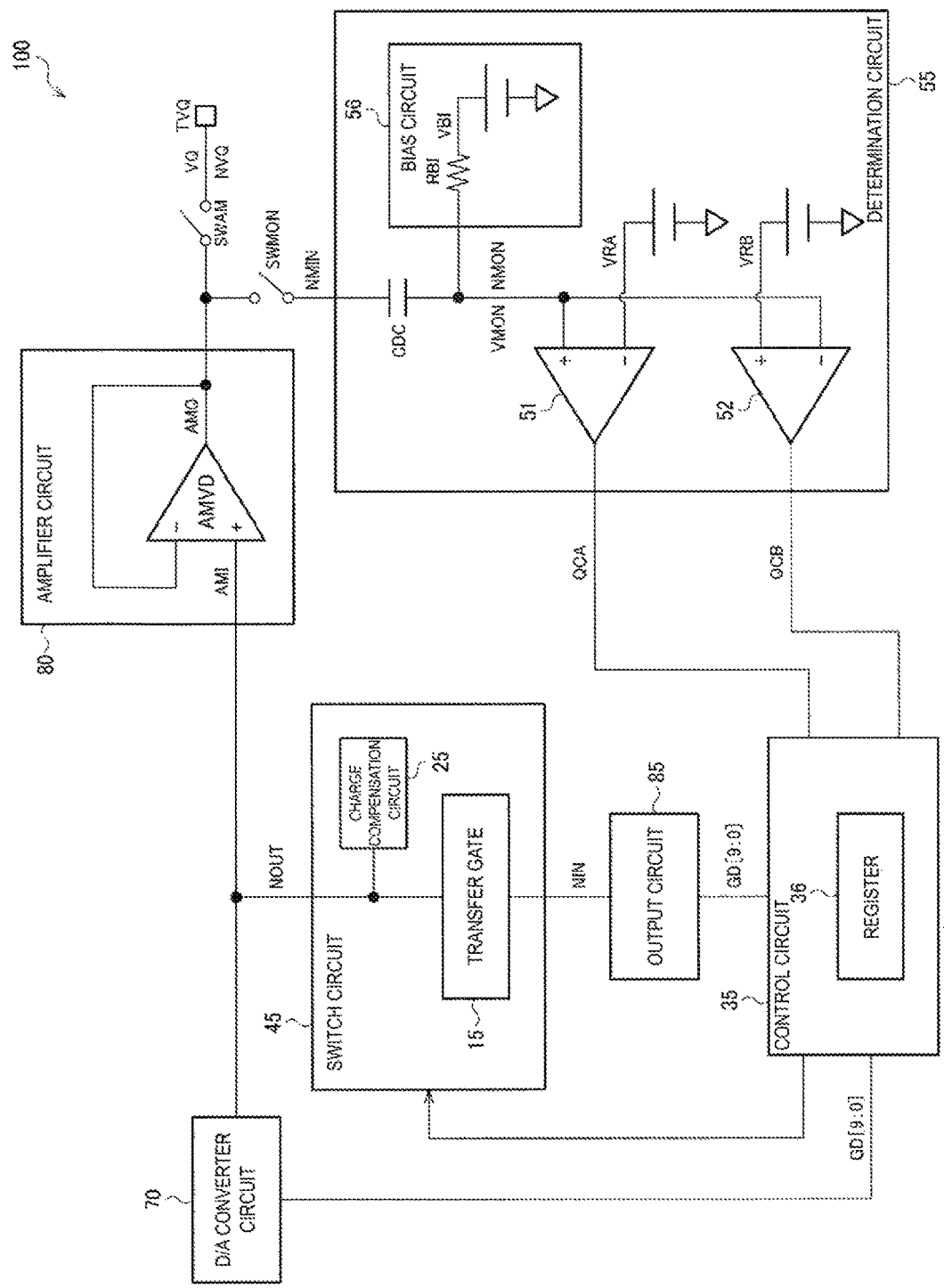
FIG. 15 is a third configuration example of the circuit device.

FIG. 15 is a third configuration example of the circuit device 100. The circuit device 100 includes the control circuit 35, the switch circuit 45, a determination circuit 55, the D/A converter circuit 70, the amplifier circuit 80, the output circuit 85, the switch SWAM, and a switch SWMON. SWMON is also referred to as a determination switch. Note that, in FIG. 15, illustration of the reference voltage generation circuit 60 is omitted. Note that the components that are the same as the components already described have the same reference numerals, and description of the components will be appropriately omitted.

The amplifier circuit 80 is a voltage follower circuit constituted of the operational amplifier AMVD. The switch SWMON is coupled between the output terminal of the operational amplifier AMVD and an input node NMIN of the determination circuit 55. The switch SWMON is a switch constituted of a transistor.

The determination circuit 55 determines feedthrough noise of the transfer gate 15 output to the output terminal of the operational amplifier AMVD. In other words, feedthrough noise generated by the transfer gate 15 passes through the operational amplifier AMVD from the non-inverting input terminal of the operational amplifier AMVD, and is output to the output terminal of the operational amplifier AMVD. The feedthrough noise output to the output terminal is a signal affected by a frequency characteristic of the operational amplifier AMVD and the like. An influence of feedthrough noise on the output side of the operational amplifier AMVD may be able to be reduced, and thus the determination circuit 55 determines the feedthrough noise on the output side of the operational amplifier AMVD.

The control circuit 35 performs noise reduction control for reducing feedthrough noise on the switch circuit 45, based on a determination result of the determination circuit 55. Specifically, the control circuit 35 causes the register 36 to store setting information about charge compensation, based on a determination result. Then, during a normal operation of the circuit device 100, that is, when the circuit device 100 drives the electro-optical panel, the control circuit 35 controls the charge compensation circuit 25, based on the setting information stored in the register 36. The control over the charge compensation circuit 25 is noise reduction control. The charge compensation circuit 25 reduces feedthrough noise by performing charge compensation, based on control from the control circuit 35, when the transfer gate 15 is turned off. The charge compensation is as described in FIGS. 1 to 14.

According to the present exemplary embodiment, the determination circuit 55 can determine feedthrough noise that varies according to a voltage of the input signal of the transfer gate 15. Then, the control circuit 35 performs the noise reduction control, based on the determination result, and thus the feedthrough noise that fluctuates according to the voltage of the input signal of the transfer gate 15 can be appropriately reduced.

Details of the determination circuit 55 will be described below. The determination circuit 55 includes a capacitor CDC being a DC cut capacitor, a bias circuit 56, a comparator 51 being a first comparison circuit, and a comparator 52 being a second comparison circuit.

The capacitor CDC is provided between the input node NMIN and a determination node NMON of the determination circuit 55. In other words, one end of the capacitor CDC is coupled to the input node NMIN, and the other end is coupled to the determination node NMON.

The bias circuit 56 sets the determination node NMON to a bias voltage VBI. The bias circuit 56 includes a resistor RBI coupled between the node of the bias voltage VBI and the determination node NMON. The bias voltage VBI is input to the determination node NMON through the resistor RBI.

The comparator 51 compares a voltage VMON of the determination node NMON with a determination voltage VRA, and outputs the result as an output signal QCA. The determination voltage VRA is a first determination voltage and is higher than the bias voltage VBI by a predetermined width $\Delta V$. The comparator 52 compares the voltage VMON of the determination node NMON with a determination voltage VRB, and outputs the result as an output signal QCB. The determination voltage VRB is a second determination voltage and is lower than the bias voltage VBI by the predetermined width $\Delta V$. $2\times\Delta V$ is a voltage width corresponding to an allowable amplitude of feedthrough noise. For example, $\Delta V=10$ mV, which is not limited thereto.

Figure 16:
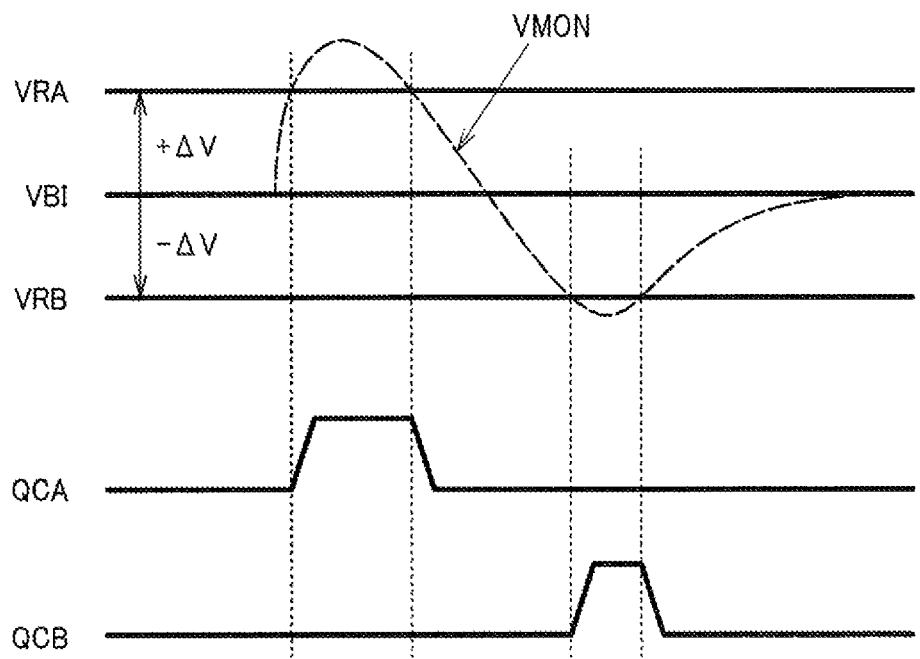
FIG. 16 is a waveform diagram illustrating an operation of a determination circuit.
Figure 17:
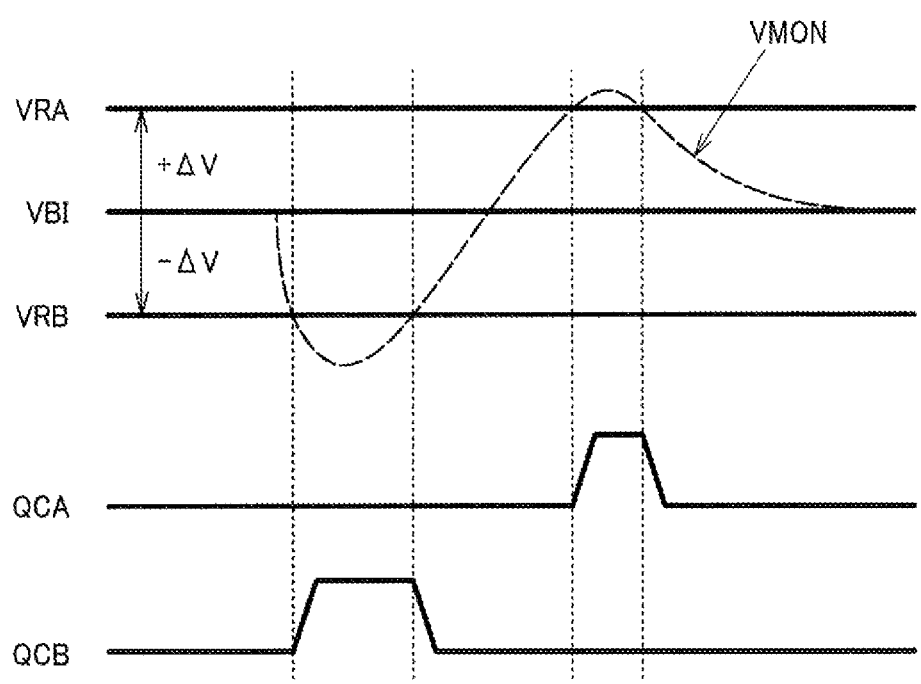
FIG. 17 is a waveform diagram illustrating an operation of the determination circuit.

FIGS. 16 and 17 are each a waveform diagram illustrating an operation of the determination circuit 55. A waveform of the voltage VMON illustrated in FIGS. 16 and 17 is a waveform of feedthrough noise when the transfer gate 15 is turned off from on.

FIG. 16 illustrates a waveform when a voltage of the input signal of the transfer gate 15 belongs to the first voltage range, that is, when the transfer gate 15 injects charge into the output node NOUT. Since the voltage VMON is DC-cut by the capacitor CDC and biased by the bias voltage VBI, feedthrough noise at the voltage VMON is only an AC component centered on the bias voltage VBI. The magnitude of the AC component is detected by the comparators 51 and 52.

In the example in FIG. 16, after the voltage VMON exceeds the determination voltage VRA, the voltage VMON falls below the determination voltage VRB. When the voltage VMON exceeds the determination voltage VRA, the output signal QCA of the comparator 51 is at the high level. When the voltage VMON falls below the determination voltage VRB, the output signal QCB of the comparator 52 is at the high level. A fluctuation in the voltage VMON due to feedthrough noise is a first fluctuation in a positive direction, and a subsequent fluctuation in a negative direction is a fluctuation due to a transient response of the operational amplifier AMVD and the like. Thus, the control circuit 35 performs calibration, based on the output signal QCA of the comparator 51 that first reaches the high level.

FIG. 17 illustrates a waveform when a voltage of the input signal of the transfer gate 15 belongs to the second voltage range, that is, when the transfer gate 15 discharges charge from the output node NOUT.

In the example in FIG. 17, after the voltage VMON falls below the determination voltage VRB, the voltage VMON exceeds the determination voltage VRA. When the voltage VMON falls below the determination voltage VRB, the output signal QCB of the comparator 52 is at the high level. When the voltage VMON exceeds the determination voltage VRA, the output signal QCA of the comparator 51 is at the high level. The control circuit 35 performs calibration, based on the output signal QCB of the comparator 52 that first reaches the high level.

Figure 18:
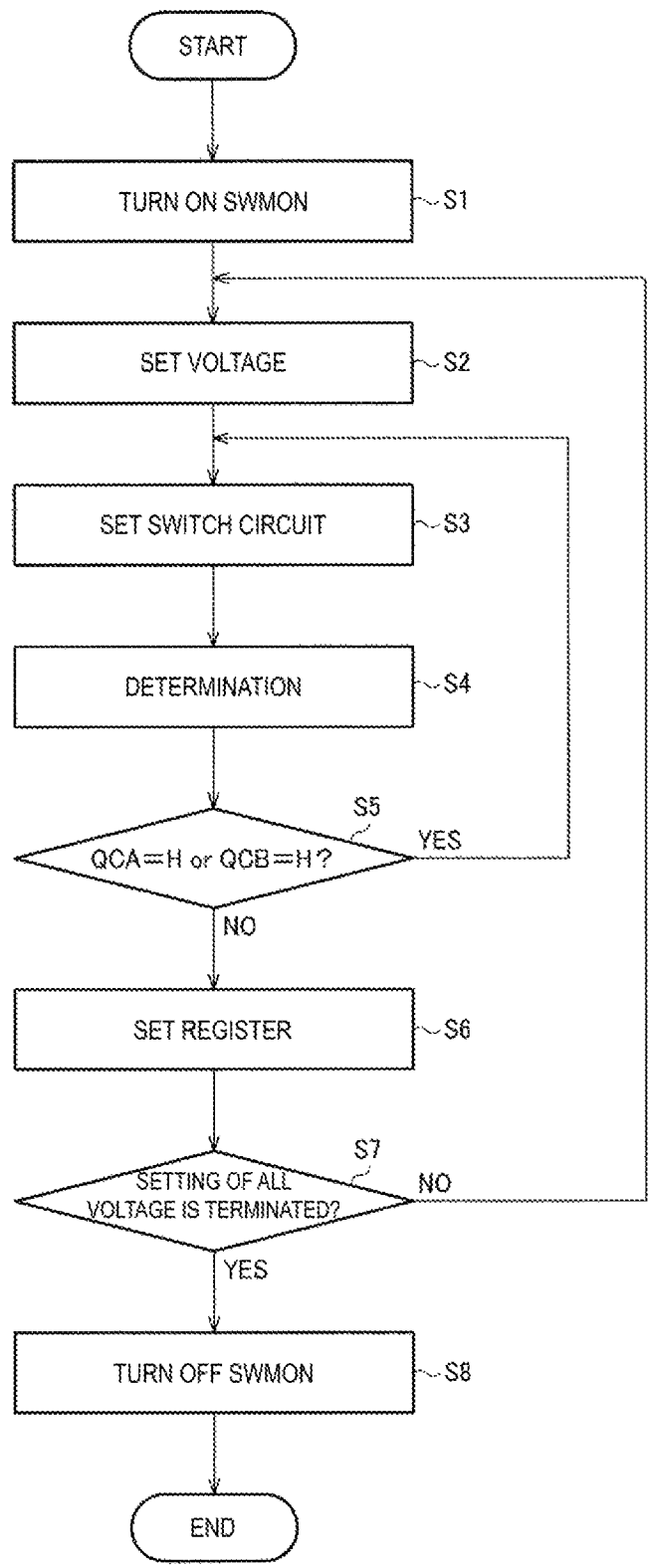
FIG. 18 is a flowchart illustrating a procedure of calibration.

FIG. 18 is a flowchart illustrating a procedure of calibration.

In step S1, the control circuit 35 turns on the switch SWMON. In step S2, the control circuit 35 sets a voltage of the input signal of the transfer gate 15. In other words, the control circuit 35 outputs the display data GD [9:0] corresponding to a voltage at which feedthrough noise is to be measured, to the D/A converter circuit 70 and the output circuit 85. For example, when a first voltage range is 7.5V to 12.5V, the control circuit 35 outputs the display data GD [9:0] corresponding to 10V that is a central value in the first voltage range.

In step S3, the control circuit 35 sets the switch circuit 45. In other words, the control circuit 35 sets an operation state of the charge compensation circuit 25 to one certain operation state by writing setting information about charge compensation to the register 36. For example, when the present calibration technique is applied to the configuration example in FIG. 5, the control circuit 35 designates a transistor to be turned on and off in charge compensation, and whether the transistor is switched from on to off or off to on. Alternatively, when the present calibration technique is applied to the configuration examples of FIGS. 10 and 11, the control circuit 35 designates a driving circuit for driving a capacitor in charge compensation, and whether the driving circuit changes the other end of the capacitor from the low level to the high level or from the high level to the low level.

In step S4, the determination circuit 55 determines feedthrough noise. In other words, the control circuit 35 operates the D/A converter circuit 70, the output circuit 85, and the switch circuit 45, thereby generating feedthrough noise when the transfer gate 15 is turned off. The determination circuit 55 determines a fluctuation in the voltage VMON due to the feedthrough noise, and outputs the output signals QCA and QCB that are the result.

In step S5, the control circuit 35 determines whether or not the output signal QCA or QCB has reached the high level in the determination operation in step S4. When the output signal QCA or QCB has reached the high level, the control circuit 35 returns to step S3. In step S3, the charge compensation circuit 25 is set to an operation state different from the previous operation state. Then, the determination circuit 55 performs the determination operation in step S4 again. In step S5, when the output signal QCA or QCB has not reached the high level, the control circuit 35 causes the register 36 to hold setting information about charge compensation at that time in step S6.

In step S7, the control circuit 35 determines whether or not calibration has performed on all voltage ranges. When there is a voltage range on which calibration has not been performed, the control circuit 35 returns to step S2, sets a voltage of a next input signal, and performs steps S3 to S6 again. In step S7, when it is determined that calibration has been performed on all voltage ranges, the control circuit 35 turns off the switch SWMON and terminates the calibration.

Note that the configuration of the circuit device 100 including the determination circuit 55 is not limited to FIG. 15, and various modifications such as those described below can be made.

For example, the determination circuit 55 may determine feedthrough noise of the transfer gate 15 output to the input terminal of the operational amplifier AMVD. In other words, the switch SWMON may be coupled between the input terminal of the operational amplifier 55 and the input node NMIN of the determination circuit 55.

Alternatively, the amplifier circuit 80 may be an inverting amplifier circuit. A configuration example of the inverting amplifier circuit will be described in FIG. 19. The switch SWMON may be coupled between the output node or the input node of the amplifier circuit 80 being the inverting amplifier circuit, and the input node NMIN of the determination circuit 55. In this case, the output node of the amplifier circuit 80 is the output terminal of the operational amplifier AMVD, and the input node of the amplifier circuit 80 is the output node NOUT of the transfer gate 15.

Figure 19:
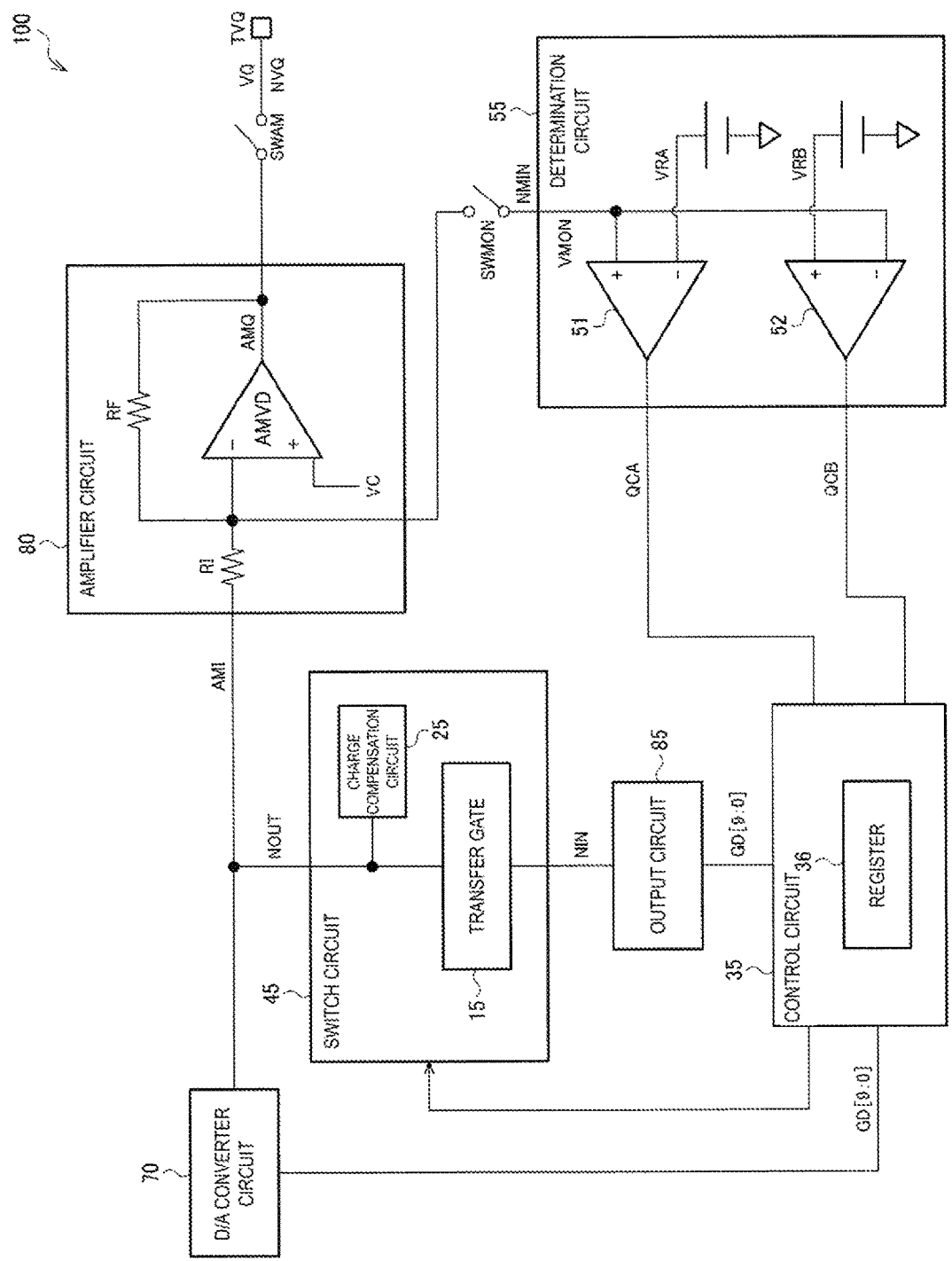
FIG. 19 is a fourth configuration example of the circuit device.

Alternatively, as in a fourth configuration example of the circuit device 100 illustrated in FIG. 19, the capacitor CDC being a DC cut capacitor may be omitted, and the switch SWMON may be coupled between the input terminal of the operational amplifier AMVD and the input node NMIN of the determination circuit 55.

Specifically, the amplifier circuit 80 includes the operational amplifier AMVD and resistors RI and RF. One end of the resistor RI is coupled to the output node NOUT of the transfer gate 15, and the other end is coupled to the inverting input terminal of the operational amplifier AMVD. One end of the resistor RF is coupled to the inverting input terminal of the operational amplifier AMVD, and the other end is coupled to the output terminal of the operational amplifier AMVD. A reference voltage VC is input to the non-inverting input terminal of the operational amplifier AMVD. The reference voltage VC corresponds to a common voltage when the electro-optical panel is driven.

The determination circuit 55 includes the comparators 51 and 52. In FIG. 19, the input node NMIN of the determination circuit 55 is a determination node. In other words, the comparator 51 compares the voltage VMON of the input node NMIN with the determination voltage VRA, and the comparator 52 compares the voltage VMON of the input node NMIN with the determination voltage VRB. The inverting input terminal of the operational amplifier AMVD becomes the reference voltage VC by a virtual short. Thus, feedthrough noise at the voltage VMON is only an AC component centered on the reference voltage VC. The magnitude of the AC component is detected by the comparators 51 and 52.

A calibration technique is similar to the technique described in FIGS. 15 to 18. In other words, the bias voltage VBI is replaced with the reference voltage VC in FIGS. 16 and 17, resulting in a waveform diagram in FIG. 19. The determination voltage VRA is higher than the reference voltage VC by ΔV, and the determination voltage VRB is lower than the reference voltage VC by ΔV. A procedure of calibration is similar to the procedure illustrated in FIG. 18.

6. Electro-Optical Device and Electronic Apparatus

Figure 20:
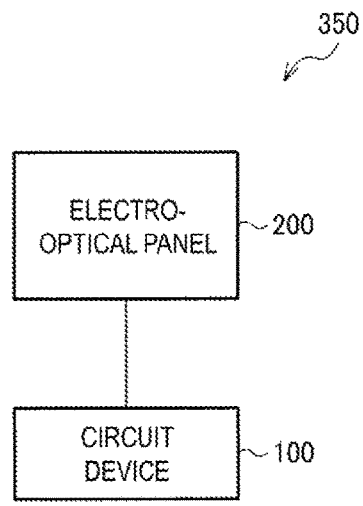
FIG. 20 is a configuration example of an electro-optical device.

FIG. 20 is a configuration example of an electro-optical device 350 including the circuit device 100. The electro-optical device 350 includes the circuit device 100 and an electro-optical panel 200. The circuit device 100 in FIG. 20 is a display driver.

The electro-optical panel 200 is, for example, an active matrix type liquid crystal display panel. For example, the circuit device 100 is mounted on a flexible substrate, the flexible substrate is coupled to the electro-optical panel 200, and the data voltage output terminal of the display driver 100 and the data voltage input terminal of the electro-optical panel 200 are coupled via a wiring line formed on the flexible substrate. Alternatively, the circuit device 100 may be mounted on a rigid substrate, the rigid substrate and the electro-optical panel 200 may be coupled via a flexible substrate, and the data voltage output terminal of the circuit device 100 and the data voltage input terminal of the electro-optical panel 200 may be coupled via a wiring line formed on the rigid substrate and the flexible substrate.

Figure 21:
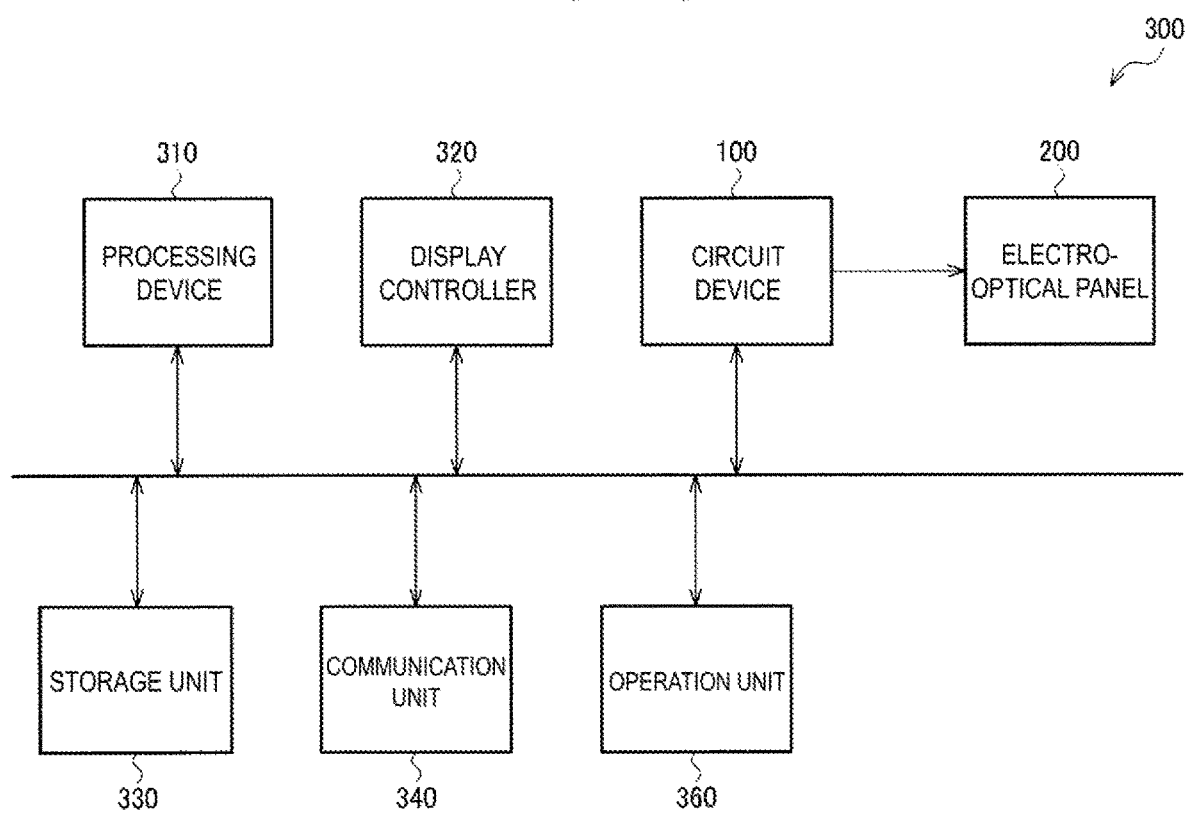
FIG. 21 is a configuration example of an electronic apparatus.

FIG. 21 is a configuration example of an electronic apparatus 300 including the circuit device 100. The electronic apparatus 300 includes a processing device 310, a display controller 320, the circuit device 100, the electro-optical panel 200, a storage unit 330, a communication unit 340, and an operation unit 360. The storage unit 330 is also called a storage device or memory. The communication unit 340 is also called a communication circuit or a communication device. The operation unit 360 is also called an operation device. In FIG. 21, a case in which the circuit device 100 is a display driver will be described as an example, but the circuit device 100 included in the electronic apparatus 300 is not limited to a display driver. For example, the electronic apparatus 300 may include the circuit device 100 including the sample hold circuit described in FIG. 14.

Specific examples of the electronic apparatus 300 may include various electronic apparatuses provided with display devices, such as a projector, a head-mounted display, a mobile information terminal, a vehicle-mounted device, a portable game terminal, and an information processing device. The vehicle-mounted device is, for example, a meter panel, a car navigation system, or the like.

The operating unit 360 is a user interface for various types of operations by a user. For example, the operating unit 360 is a button, a mouse, a keyboard, and/or a touch panel mounted on the electro-optical panel 200. The communication unit 340 is a data interface used for inputting and outputting image data and control data. Examples of the communication unit 340 include a wireless communication interface, such as a wireless LAN interface or a near field communication interface, and a wired communication interface, such as wired LAN interface or a USB interface. The storage unit 330, for example, stores data input from the communication unit 340 or functions as a working memory for the processing device 310. The storage unit 330 is, for example, a memory, such as a RAM or a ROM, a magnetic storage device, such as an HDD, or an optical storage device, such as a CD drive or a DVD drive. The display controller 320 processes image data input from the communication unit 340 or stored in the storage unit 330, and transfers the processed image data to the circuit device 100. The circuit device 100 displays an image on the electro-optical panel 200, based on the image data transferred from the display controller 320. The processing device 310 performs control processing for the electronic apparatus 300, various types of signal processing, and the like. The processing device 310 is, for example, a processor, such as a CPU or an MPU, or an ASIC.

For example, when the electronic apparatus 300 is a projector, the electronic apparatus 300 further includes a light source and an optical system. The optical system is, for example, a lens, a prism, a mirror, or the like. When the electro-optical panel 200 is of a transmissive type, the optical device emits light from the light source to the electro-optical panel 200, and the light transmitted through the electro-optical panel 200 is projected on a screen. When the electro-optical panel 200 is of a reflective type, the optical device emits light from the light source to the electro-optical panel 200, and the light reflected at the electro-optical panel 200 is projected on a screen.

The circuit device according to the present exemplary embodiment described above includes a transfer gate, a charge compensation circuit, and a control circuit. The transfer gate includes a P-type transistor and an N-type transistor coupled in parallel between an input node and an output node. The transfer gate receives an input of an input signal to the input node, and the transfer gate outputs an output signal to the output node. The charge compensation circuit is coupled to the output node of the transfer gate, and performs charge discharge from the output node of the transfer gate or charge injection into the output node of the transfer gate. The control circuit controls the charge compensation circuit. Based on control from the control circuit, the charge compensation circuit performs the charge discharge when a voltage of the input signal is in a first voltage range at a timing at which the transfer gate is turned off, and performs the charge injection when a voltage of the input signal is in a second voltage range lower than the first voltage range at a timing at which the transfer gate is turned off.

According to the present exemplary embodiment, when a voltage of the input signal is in the first voltage range, feedthrough noise due to the charge injection of the transfer gate can be reduced by the charge compensation circuit performing the charge discharge. Further, when a voltage of the input signal is in the second voltage range, feedthrough noise due to the charge discharge of the transfer gate can be reduced by the charge compensation circuit performing the charge injection. As a result, feedthrough noise dependent on a voltage of the input signal can be appropriately reduced.

Further, in the present exemplary embodiment, the charge compensation circuit may include a transistor group including a source and a drain coupled to the output node. The control circuit may control the charge compensation circuit by outputting a control signal group to a gate of the transistor group.

The charge discharge and the charge injection can be switched by the control circuit turning on and off any of the transistors in the transistor group, and the charge amount at that time can also be controlled. In this way, the control circuit outputs the control signal group to the gate of the transistor group, and thus a reduction in feedthrough noise by the charge compensation circuit can be controlled.

Further, in the present exemplary embodiment, the transistor group may include an N-type transistor group. When a voltage of the input signal is in the first voltage range at a timing at which the transfer gate is turned off, the charge compensation circuit may perform the charge discharge by one or a plurality of N-type transistors in the N-type transistor group being turned off from on based on the control signal group. When a voltage of the input signal is in the second voltage range at a timing at which the transfer gate is turned off, the charge compensation circuit may perform the charge injection by one or a plurality of N-type transistors in the N-type transistor group being turned on from off based on the control signal group.

In this way, in a case in which the N-type transistor is used as the transistor group of the charge compensation circuit, when a voltage of the input signal is in the first voltage range, the charge compensation circuit can perform the charge discharge, and when a voltage of the input signal is in the second voltage range, the charge compensation circuit can perform the charge injection.

Further, in the present exemplary embodiment, the transistor group may include a P-type transistor group. When a voltage of the input signal is in the first voltage range at a timing at which the transfer gate is turned off, the charge compensation circuit may perform the charge discharge by one or a plurality of P-type transistors in the P-type transistor group being turned on from off based on the control signal group. When a voltage of the input signal is in the second voltage range at a timing at which the transfer gate is turned off, the charge compensation circuit may perform the charge injection by one or a plurality of P-type transistors in the P-type transistor group being turned off from on based on the control signal group.

In this way, in a case in which the P-type transistor is used as the transistor group of the charge compensation circuit, when a voltage of the input signal is in the first voltage range, the charge compensation circuit can perform the charge discharge, and when a voltage of the input signal is in the second voltage range, the charge compensation circuit can perform the charge injection.

Further, in the present exemplary embodiment, the charge compensation circuit may include a capacitor group including one end coupled to the output node, and a driving circuit group configured to drive the other end of the capacitor group, based on a control signal group from the control circuit. The control circuit may control the charge compensation circuit by outputting the control signal group to the driving circuit group.

The charge discharge and the charge injection can be switched by the driving circuit group driving any of the capacitors in the capacitor group, and the charge amount at that time can also be controlled. In this way, the control circuit outputs the control signal group to the driving circuit group, and thus a reduction in feedthrough noise by the charge compensation circuit can be controlled.

Further, in the present exemplary embodiment, the charge compensation circuit may include a capacitor including one end coupled to the output node, a capacitor group including one end coupled to the other end of the capacitor, and a driving circuit group configured to drive the other end of the capacitor group, based on a control signal group from the control circuit. The control circuit may control the charge compensation circuit by outputting the control signal group to the driving circuit group.

Also, in this configuration, the charge discharge and the charge injection can be switched by the driving circuit group driving any of the capacitors in the capacitor group, and the charge amount at that time can also be controlled. In other words, the control circuit outputs the control signal group to the driving circuit group, and thus a reduction in feedthrough noise by the charge compensation circuit can be controlled. Since the amount of charge in charge compensation becomes small by coupling the capacitor in series to the capacitor group, a high-resolution feedthrough noise reduction can be performed.

Further, in the present exemplary embodiment, when a voltage of the input signal is in the first voltage range at a timing at which the transfer gate is turned off, the charge compensation circuit may perform the charge discharge by the driving circuit group changing a voltage at the other end of one or a plurality of capacitors in the capacitor group from a first voltage to a second voltage lower than the first voltage, based on the control signal group. When a voltage of the input signal is in the second voltage range at a timing at which the transfer gate is turned off, the charge compensation circuit may perform the charge injection by the driving circuit group changing a voltage at the other end of one or a plurality of capacitors in the capacitor group from the second voltage to the first voltage, based on the control signal group.

In this way, in the configuration in which the charge compensation circuit includes the capacitor group and the driving circuit group, when a voltage of the input signal is in the first voltage range, the charge compensation circuit can perform the charge discharge, and when a voltage of the input signal is in the second voltage range, the charge compensation circuit can perform the charge injection.

Further, in the present exemplary embodiment, when a voltage of the input signal is in a third voltage range lower than the first voltage range and higher than the second voltage range at a timing at which the transfer gate is turned off, the charge compensation circuit may perform the charge discharge at the amount of charge smaller than the amount of discharged charge when a voltage of the input signal is in the first voltage range.

In this way, when the charge compensation circuit performs the charge discharge, the amount of discharged charge can be controlled with a higher degree of accuracy. As a result, a more appropriate noise reduction can be performed with respect to an amplitude of feedthrough noise according to each voltage range.

Further, in the present exemplary embodiment, when a voltage of the input signal is in a fourth voltage range higher than the second voltage range and lower than the third voltage range at a timing at which the transfer gate is turned off, the charge compensation circuit may perform the charge injection at the amount of charge smaller than the amount of injected charge when a voltage of the input signal is in the second voltage range.

In this way, when the charge compensation circuit performs the charge injection, the amount of injected charge can be controlled with a higher degree of accuracy. As a result, a more appropriate noise reduction can be performed with respect to an amplitude of feedthrough noise according to each voltage range.

Further, in the present exemplary embodiment, the circuit device may further include an output circuit configured to output the input signal to the input node of the transfer gate, based on input data. The control circuit may determine, based on the input data, whether or not a voltage of the input signal belongs to the first voltage range and whether or not a voltage of the input signal belongs to the second voltage range.

Since the output circuit outputs the input signal to the input node of the transfer gate, based on the input data, the input data are data corresponding to a voltage of the input signal. As a result, the control circuit can determine, based on the input data, a voltage range to which a voltage of the input signal belongs.

Further, in the present exemplary embodiment, the circuit device may further include a D/A converter circuit and an amplifier circuit. The D/A converter circuit may output, to the output node of the transfer gate, a D/A conversion voltage acquired by performing D/A conversion on the input data. The amplifier circuit may receive an input of a signal of the output node of the transfer gate.

Feedthrough noise generated by the transfer gate affects accuracy of a signal output from the amplifier circuit. According to the present exemplary embodiment, since the charge compensation circuit reduces feedthrough noise, the accuracy of a signal output from the amplifier circuit can be improved.

Further, in the present exemplary embodiment, when the transfer gate is on, the output signal corresponding to the input signal may be output to the output node of the transfer gate by the output circuit outputting the input signal to the input node of the transfer gate. After the transfer gate is turned off from on, the D/A converter circuit may output the D/A conversion voltage to the output node of the transfer gate.

Feedthrough noise generated by the transfer gate converges by the D/A converter circuit after the transfer gate is turned off. However, there is a possibility that feedthrough noise may not converge within a period in which the D/A converter circuit outputs the D/A conversion voltage. According to the present exemplary embodiment, since the charge compensation circuit reduces feedthrough noise, the feedthrough noise can converge within tolerances within the period in which the D/A converter circuit outputs the D/A conversion voltage.

Further, in the present exemplary embodiment, the amplifier circuit may drive an electro-optical panel.

According to the present exemplary embodiment, accuracy of a signal output from the amplifier circuit can be improved by the charge compensation circuit reducing feedthrough noise. As a result, accuracy of the data voltage that drives the electro-optical panel can be improved, and thus display quality is improved.

Further, an electro-optical device according to the present exemplary embodiment includes the circuit device described above, and the electro-optical panel.

Further, an electronic apparatus according to the present exemplary embodiment includes the circuit device according to any of the descriptions above.

Although the present exemplary embodiment has been described in detail above, those skilled in the art will easily understand that many modified examples can be made without substantially departing from novel items and effects of the present disclosure. All such modified examples are thus included in the scope of the disclosure. For example, terms in the descriptions or drawings given even once along with different terms having identical or broader meanings can be replaced with those different terms in all parts of the descriptions or drawings. All combinations of the exemplary embodiment and modified examples are also included within the scope of the disclosure. Furthermore, the configurations, operations, and the like of the circuit device, the electro-optical device, the electronic apparatus, and the like are not limited to those described in the exemplary embodiment, and various modifications thereof are possible.

What is claimed is:

1. A circuit device, comprising:
a transfer gate including a P-type transistor and an N-type transistor coupled in parallel between an input node and an output node, and being configured to input an input signal to the input node, and output an output signal to the output node;
a charge compensation circuit coupled to the output node, and configured to perform charge discharge from the output node or charge injection into the output node; and
a control circuit configured to control the charge compensation circuit, wherein
based on control from the control circuit, the charge compensation circuit performs the charge discharge when a voltage of the input signal is in a first voltage range at a timing at which the transfer gate is turned off, and performs the charge injection when a voltage of the input signal is in a second voltage range lower than that in the first voltage range at a timing at which the transfer gate is turned off.

2. The circuit device according to claim 1, wherein
the charge compensation circuit includes a transistor group including a source and a drain, and coupled to the output node, and
the control circuit controls the charge compensation circuit by outputting a control signal group to a gate of the transistor group.

3. The circuit device according to claim 2, wherein
the transistor group includes an N-type transistor group,
when a voltage of the input signal is in the first voltage range at a timing at which the transfer gate is turned off, the charge compensation circuit performs the charge discharge, with one or a plurality of N-type transistors in the N-type transistor group being turned off from on, based on the control signal group, and
when a voltage of the input signal is in the second voltage range at a timing at which the transfer gate is turned off, the charge compensation circuit performs the charge injection, with one or a plurality of N-type transistors in the N-type transistor group being turned on from off, based on the control signal group.

4. The circuit device according to claim 2, wherein
the transistor group includes a P-type transistor group,
when a voltage of the input signal is in the first voltage range at a timing at which the transfer gate is turned off, the charge compensation circuit performs the charge discharge, with one or a plurality of P-type transistors in the P-type transistor group being turned on from off, based on the control signal group, and
when a voltage of the input signal is in the second voltage range at a timing at which the transfer gate is turned off, the charge compensation circuit performs the charge injection, with one or a plurality of P-type transistors in the P-type transistor group being turned off from on, based on the control signal group.

5. The circuit device according to claim 1, wherein
the charge compensation circuit includes
a capacitor group including one end coupled to the output node, and
a driving circuit group configured to drive another end of the capacitor group, based on a control signal group from the control circuit, and
the control circuit controls the charge compensation circuit by outputting the control signal group to the driving circuit group.

6. The circuit device according to claim 5, wherein
when a voltage of the input signal is in the first voltage range at a timing at which the transfer gate is turned off, the charge compensation circuit performs the charge discharge, with the driving circuit group changing a voltage at the another end of one or a plurality of capacitors in the capacitor group from a first voltage to a second voltage, which is lower than the first voltage, based on the control signal group, and
when a voltage of the input signal is in the second voltage range at a timing at which the transfer gate is turned off, the charge compensation circuit performs the charge injection, with the driving circuit group changing a voltage at the another end of one or a plurality of capacitors in the capacitor group from the second voltage to the first voltage, based on the control signal group.

7. The circuit device according to claim 1, wherein
the charge compensation circuit includes
a capacitor including one end coupled to the output node,
a capacitor group including one end coupled to another end of the capacitor, and a driving circuit group configured to drive another end of the capacitor group, based on a control signal group from the control circuit, and the control circuit controls the charge compensation circuit by outputting the control signal group to the driving circuit group.

8. The circuit device according to claim 1, wherein
when a voltage of the input signal is in a third voltage range lower than that in the first voltage range and higher than that in the second voltage range at a timing at which the transfer gate is turned off, the charge compensation circuit performs the charge discharge at an amount of charge smaller than an amount of discharged charge when a voltage of the input signal is in the first voltage range.

9. The circuit device according to claim 8, wherein
when a voltage of the input signal is in a fourth voltage range higher than that in the second voltage range and lower than that in the third voltage range at a timing at which the transfer gate is turned off, the charge compensation circuit performs the charge injection at an amount of charge smaller than an amount of injected charge when a voltage of the input signal is in the second voltage range.

10. The circuit device according to claim 1, comprising an output circuit configured to output the input signal to the input node, based on input data, wherein the control circuit determines, based on the input data, whether a voltage of the input signal belongs to the first voltage range and whether a voltage of the input signal belongs to the second voltage range.

11. The circuit device according to claim 10, comprising:
a D/A converter circuit configured to output, to the output node, a D/A conversion voltage acquired by performing D/A conversion on the input data; and
an amplifier circuit configured to receive a signal of the output node.

12. The circuit device according to claim 11, wherein
when the transfer gate is on, the output signal corresponding to the input signal is output to the output node, with the output circuit outputting the input signal to the input node, and
after the transfer gate is turned off from on, the D/A converter circuit outputs the D/A conversion voltage to the output node.

13. The circuit device according to claim 11, wherein
the amplifier circuit drives an electro-optical panel.

14. An electro-optical device, comprising:
the circuit device according to claim 13; and
the electro-optical panel.

15. An electronic apparatus comprising the circuit device according to claim 1.

* * * * *